(12) United States Patent
Hayashi et al.

(10) Patent No.: US 11,879,607 B2
(45) Date of Patent: Jan. 23, 2024

(54) LIGHT-EMITTING DEVICE AND MANUFACTURING METHOD THEREOF

(71) Applicant: NICHIA CORPORATION, Anan (JP)

(72) Inventors: Tatsuya Hayashi, Tokushima (JP); Shinya Okura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/306,626

(22) Filed: Apr. 25, 2023

(65) Prior Publication Data

US 2023/0349525 A1    Nov. 2, 2023

(30) Foreign Application Priority Data

Apr. 28, 2022 (JP) .................... 2022-075066
Jul. 22, 2022 (JP) .................... 2022-116849
Oct. 14, 2022 (JP) .................... 2022-165334

(51) Int. Cl.
*F21S 41/176*    (2018.01)
*F21S 41/141*    (2018.01)

(52) U.S. Cl.
CPC .......... *F21S 41/176* (2018.01); *F21S 41/141* (2018.01)

(58) Field of Classification Search
CPC .............................. F21S 41/176; F21S 41/141
See application file for complete search history.

(56) References Cited

U.S. PATENT DOCUMENTS

| | | | | |
|---|---|---|---|---|
| 11,168,865 B2* | 11/2021 | Kuramoto | .......... | G02B 19/0014 |
| 11,740,401 B2* | 8/2023 | Emura | ................ | G02B 6/0068 438/22 |
| 11,742,465 B2* | 8/2023 | Eom | ...................... | H01L 33/56 362/297 |
| 2011/0026266 A1 | 2/2011 | Sasaki et al. | | |
| 2011/0300644 A1 | 12/2011 | Akimoto et al. | | |
| 2012/0051075 A1 | 3/2012 | Harada et al. | | |
| 2013/0082294 A1 | 4/2013 | Nakayama et al. | | |
| 2013/0100692 A1 | 4/2013 | Yokobayashi | | |

(Continued)

FOREIGN PATENT DOCUMENTS

| | | |
|---|---|---|
| CN | 105336836 A | 2/2016 |
| CN | 108807647 A | 11/2018 |

(Continued)

*Primary Examiner* — Christopher E Dunay

(74) *Attorney, Agent, or Firm* — Global IP Counselors, LLP

(57) ABSTRACT

A light-emitting device includes a light-emitting element, the wavelength conversion member, and a light adjustment member. The light-emitting element includes a support substrate, and a first light-emitting portion and a second light-emitting portion disposed adjacent to each other. The wavelength conversion member is configured to perform wavelength conversion of first light emitted from the first light-emitting portion and second light emitted from the second light-emitting portion into third light. The light adjustment member overlaps one of the first light-emitting portion and the second light-emitting portion in a plan view. In the light-emitting element, an emission intensity of the first light at a light emission peak wavelength of the second light is lower than an emission intensity of the second light at the light emission peak wavelength of the second light, during light emission of the light-emitting device.

21 Claims, 22 Drawing Sheets

(56) References Cited

U.S. PATENT DOCUMENTS

| | | | |
|---|---|---|---|
| 2014/0175491 A1 | 6/2014 | Sanga et al. | |
| 2016/0372515 A1 | 12/2016 | Miyoshi et al. | |
| 2018/0090646 A1 | 3/2018 | Kato et al. | |
| 2020/0041085 A1 | 2/2020 | Miyairi et al. | |
| 2020/0203419 A1* | 6/2020 | Andrews | H01L 33/32 |
| 2020/0220057 A1* | 7/2020 | Kim | H01L 33/20 |
| 2020/0279979 A1 | 9/2020 | Lee et al. | |
| 2020/0393103 A1 | 12/2020 | Miyairi et al. | |
| 2022/0102596 A1* | 3/2022 | Matsuda | H01L 33/504 |
| 2022/0199695 A1* | 6/2022 | Takiguchi | G09F 9/30 |
| 2022/0316683 A1* | 10/2022 | Yoshida | F21V 5/007 |

FOREIGN PATENT DOCUMENTS

| | | | |
|---|---|---|---|
| JP | 2009266434 A | 11/2009 | |
| JP | 2011134829 A | 7/2011 | |
| JP | 2012049022 A | 3/2012 | |
| JP | 2013089814 A | 5/2013 | |
| JP | 2014127513 A | 7/2014 | |
| JP | 2017011259 A | 1/2017 | |
| JP | 2018056359 A | 4/2018 | |
| JP | 2020025063 A | 2/2020 | |
| JP | 2020120082 A | 8/2020 | |

* cited by examiner

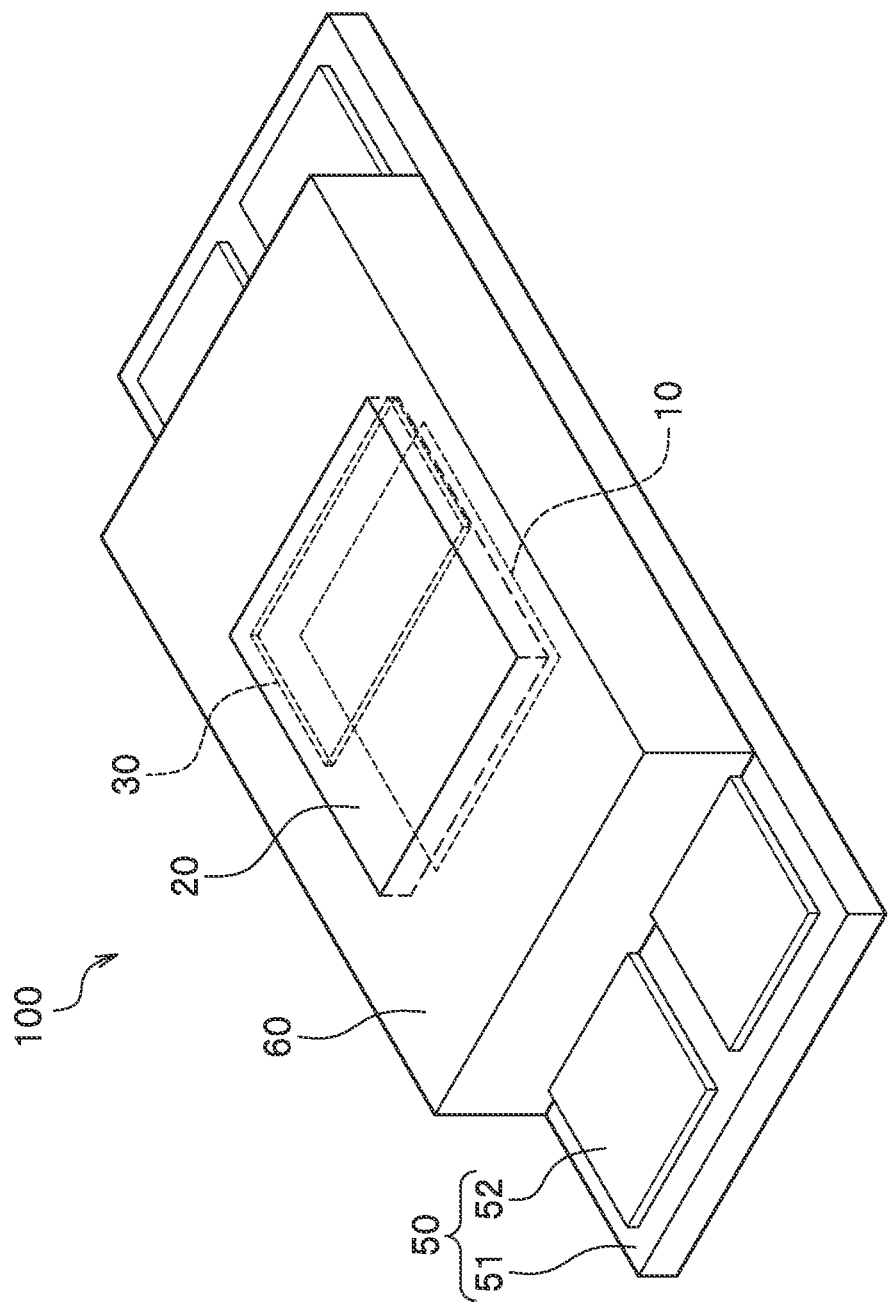

LIGHT-EMITTING DEVICE AND MANUFACTURING METHOD THEREOF

CROSS-REFERENCE TO RELATED APPLICATIONS

The present application claims priority to Japanese Patent Application No. 2022-075066, filed on Apr. 28, 2022, Japanese Patent Application No. 2022-116849, filed on Jul. 22, 2022, and Japanese Patent Application No. 2022-165334, filed on Oct. 14, 2022, the disclosures of which are hereby incorporated herein by reference in their entireties.

BACKGROUND

An embodiment of the present disclosure relates to a light-emitting device and a manufacturing method thereof.

In recent years, LEDs have been used as light sources for vehicle lamps such as headlights. For example, Japanese Patent Publication No. 2017-011259 discloses a light-emitting device having a light distribution pattern suitable for a headlight with use of a combination of a plurality of light-emitting elements having different areas.

SUMMARY

It is an object of the embodiment of the present disclosure to provide a light-emitting device that can be miniaturized and a method for manufacturing such a light-emitting device.

A light-emitting device according to an embodiment of the present disclosure includes a light-emitting element, a wavelength conversion member, and a light adjustment member. The light-emitting element includes a support substrate having a first surface and a second surface opposite to the first surface, and a first light-emitting portion and a second light-emitting portion disposed adjacent to each other on the second surface of the support substrate. The first light-emitting portion and the second light-emitting portion each includes a semiconductor layered body including a first semiconductor layer, a light-emitting layer, and a second semiconductor layer in this order. The wavelength conversion member is disposed on the first surface of the support substrate and contains a phosphor configured to perform wavelength conversion of first light emitted from the first light-emitting portion and second light emitted from the second light-emitting portion into third light. The light adjustment member is disposed on a surface of the wavelength conversion member opposite to a surface on the support substrate side or disposed inside the wavelength conversion member and overlaps one of the first light-emitting portion and the second light-emitting portion in a plan view. In the light-emitting element, an emission intensity of the first light at a light emission peak wavelength of the second light is lower than an emission intensity of the second light at the light emission peak wavelength of the second light, during light emission of the light-emitting device.

A method for manufacturing a light-emitting device according to an embodiment of the present disclosure includes preparing a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order; preparing a wavelength conversion member having a first surface and a second surface opposite to the first surface and containing a phosphor configured to perform wavelength conversion of first light emitted from the first light-emitting portion and second light emitted from the second light-emitting portion into third light, with a light adjustment member disposed on the first surface of the wavelength conversion member or inside the wavelength conversion member; and disposing the wavelength conversion member provided with the light adjustment member such that the second surface of the wavelength conversion member faces the first surface of the support substrate and the light adjustment member overlaps one of the first light-emitting portion and the second light-emitting portion in a plan view.

According to the embodiments of the present disclosure, a light-emitting device that can be miniaturized and a method for manufacturing such a light-emitting device can be provided.

BRIEF DESCRIPTION OF DRAWING

FIG. 1A is a schematic perspective view illustrating an example of a light-emitting device according to a first embodiment.

DETAILED DESCRIPTION

Figure 1B:
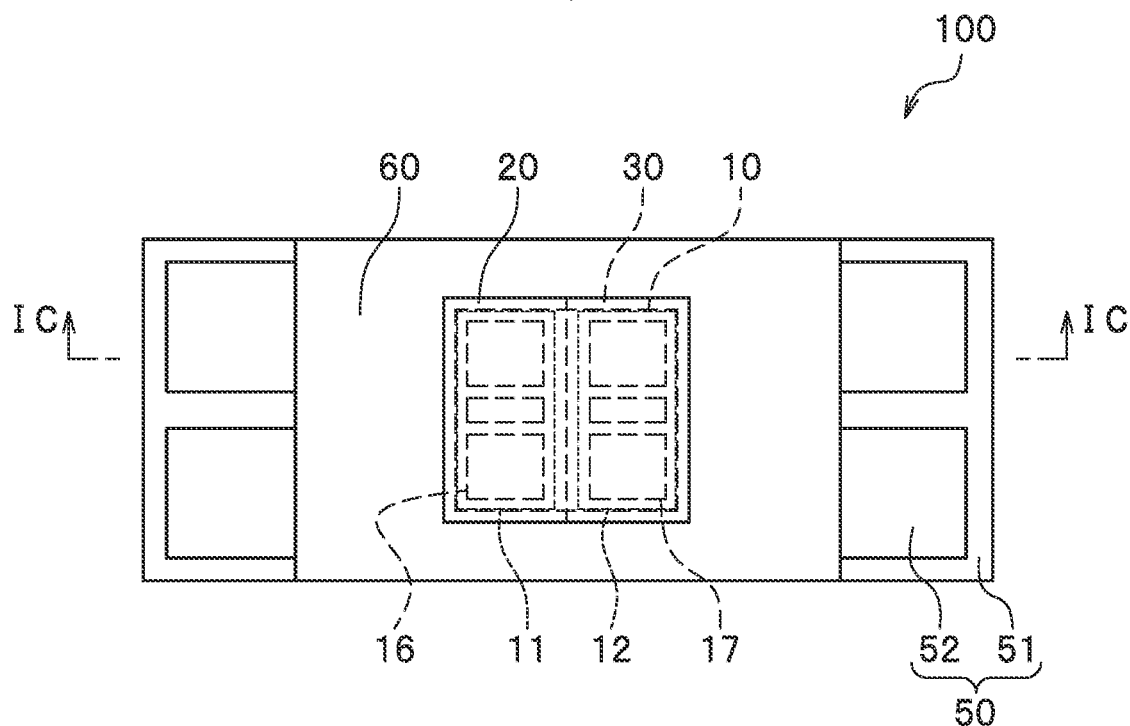
FIG. 1B is a schematic plan view illustrating an example of the light-emitting device according to the first embodiment.

Embodiments will be described below with reference to the drawings. The following embodiments are examples of light-emitting devices and methods for manufacturing the light-emitting devices to embody the technical concept of the present embodiments, and are not limited to those illustrated below. In addition, dimensions, materials, shapes, relative arrangements, or the like of components described in the embodiments are not intended to limit the scope of the present disclosure thereto, unless otherwise specified, and are merely exemplary. Note that, size, positional relationship, and the like of members illustrated in the drawings can be exaggerated or simplified for clarity of description. To avoid overcomplicating the drawings, some elements may be omitted or end views illustrating only cut surfaces may be used as cross-sectional views. As used herein, the term "covering" is not limited to cases of direct contact, but also includes cases of indirect covering a member, for example, via another member. Furthermore, "disposing" is not limited to cases of direct contact, but also includes cases of indirectly disposing a member, for example, via another member.

First Embodiment

Figure 1C:
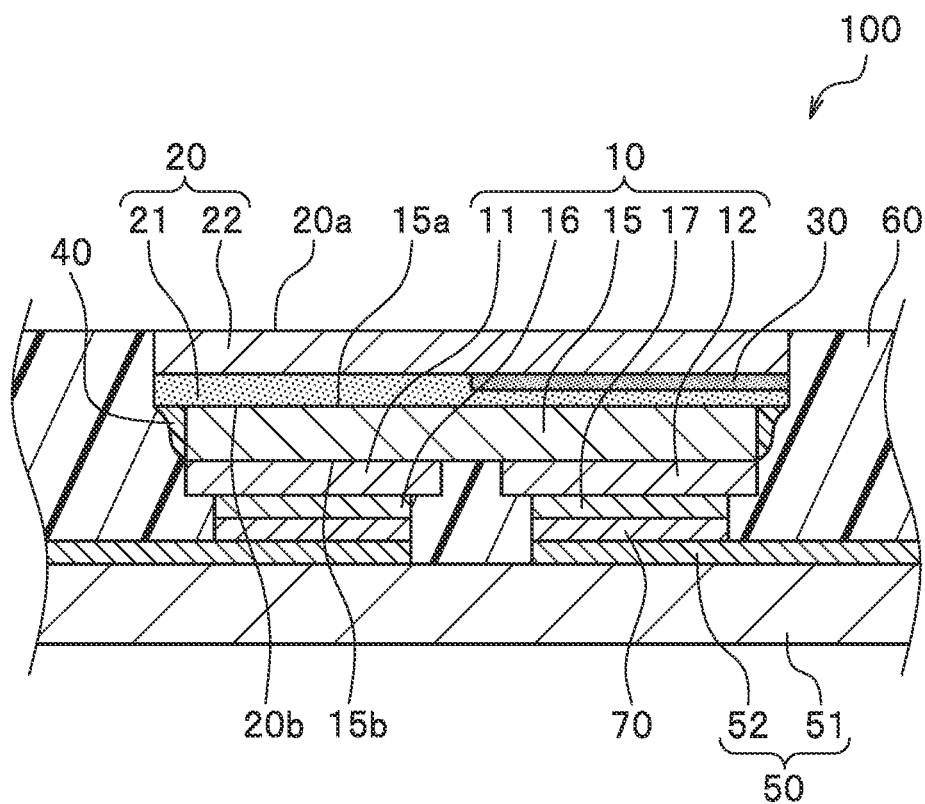
FIG. 1C is a schematic cross-sectional view taken along line IC-IC of FIG. 1B.
Figure 1D:
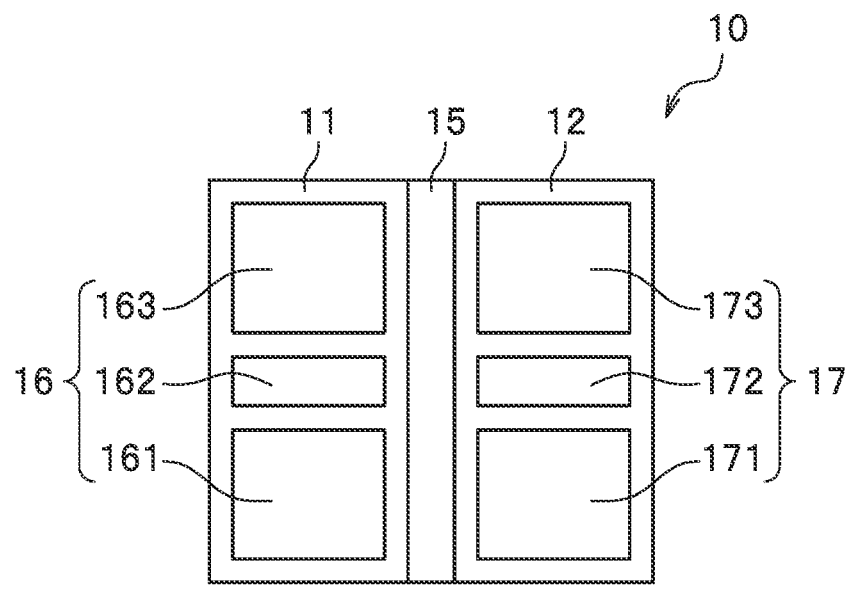
FIG. 1D is a schematic bottom view illustrating an example of a light-emitting element of the light-emitting device according to the first embodiment.
Figure 1E:
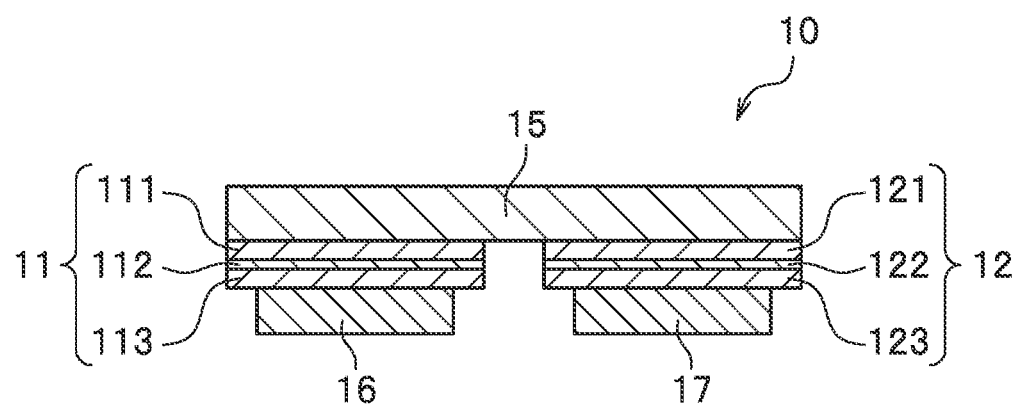
FIG. 1E is a schematic cross-sectional view illustrating an example of the light-emitting element of the light-emitting device according to the first embodiment.
Figure 1F:
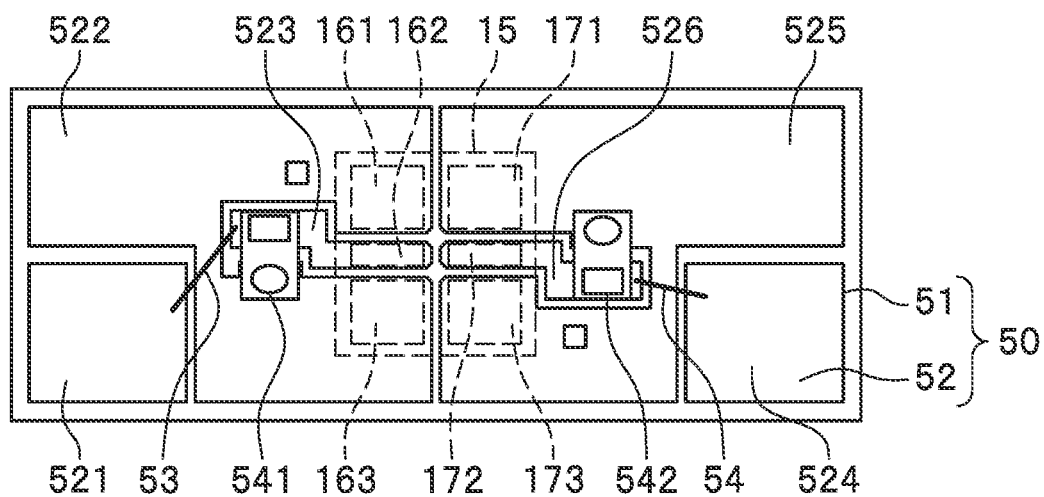
FIG. 1F is a schematic plan view for explaining a wiring substrate of the light-emitting device according to the first embodiment.
Figure 1G:
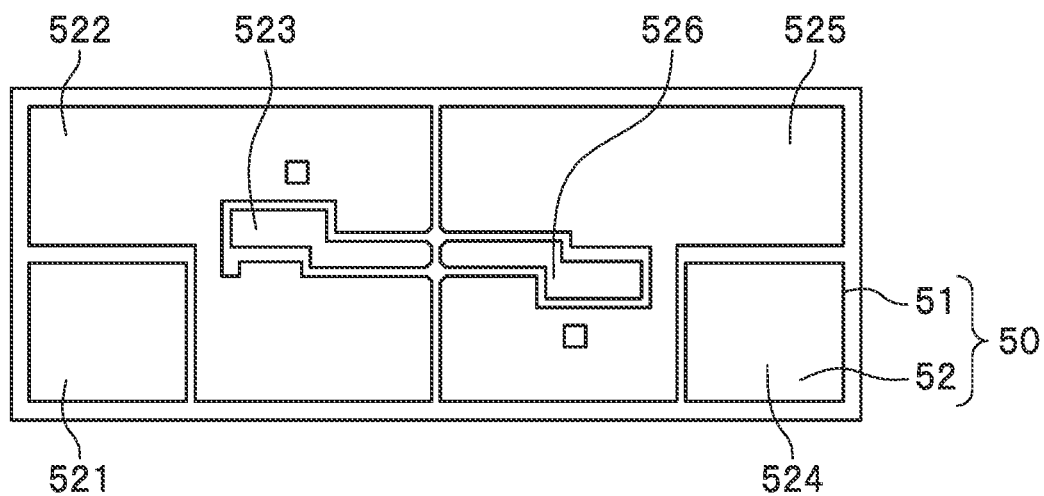
FIG. 1G is a schematic plan view illustrating an example of a wiring substrate of the light-emitting device according to the first embodiment.
Figure 2A:
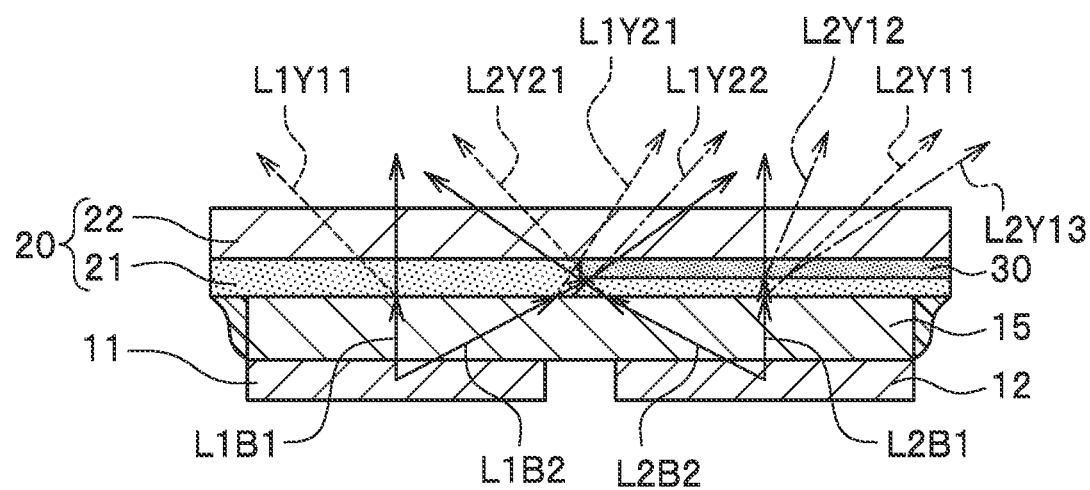
FIG. 2A is a schematic cross-sectional view for explaining an optical path of light from light-emitting portions of the light-emitting device according to the first embodiment.
Figure 2B:
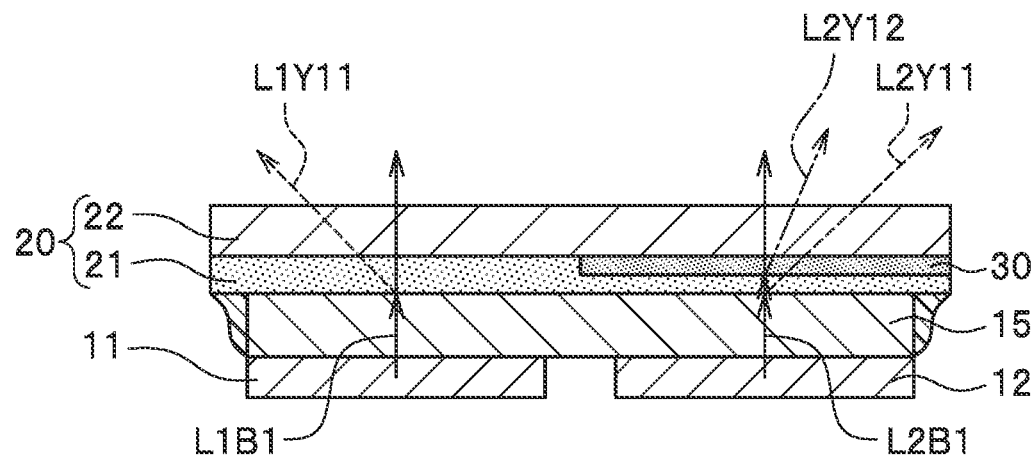
FIG. 2B is a schematic cross-sectional view simplifying FIG. 2A.

Light-Emitting Device FIG. 1A is a schematic perspective view illustrating an example of a light-emitting device according to a first embodiment. FIG. 1B is a schematic plan view illustrating an example of the light-emitting device according to the first embodiment. FIG. 1C is a schematic cross-sectional view taken along line IC-IC of FIG. 1B. FIG. 1D is a schematic bottom view illustrating an example of a light-emitting element of the light-emitting device according to the first embodiment. FIG. 1E is a schematic cross-sectional view illustrating an example of the light-emitting element of the light-emitting device according to the first embodiment. FIG. 1F is a schematic plan view for explaining a wiring substrate of the light-emitting device according to the first embodiment. FIG. 1G is a schematic plan view illustrating an example of the wiring substrate of the light-emitting device according to the first embodiment. FIG. 2A is a schematic cross-sectional view for explaining an optical path of light from a light-emitting portion of the light-emitting device according to the first embodiment. FIG. 2B is a schematic cross-sectional view simplifying FIG. 2A.

A light-emitting device 100 includes a light-emitting element 10 including a support substrate 15 having a first surface 15a and a second surface 15b opposite to the first surface 15a, and a first light-emitting portion 11 and a second light-emitting portion 12 disposed adjacent to each other on the second surface 15b of the support substrate 15, the first light-emitting portion 11 including a semiconductor layered body including a first semiconductor layer 111, a light-emitting layer 112, and a second semiconductor layer 113 in this order and the second light-emitting portion 12 including a semiconductor layered body including a first semiconductor layer 121, a light-emitting layer 122, and a second semiconductor layer 123 in this order; a wavelength conversion member 20 disposed on the first surface 15a of the support substrate 15 and containing a phosphor that performs wavelength conversion of first light emitted from the first light-emitting portion 11 and second light emitted from the second light-emitting portion 12 into third light; and a light adjustment member 30 disposed on a surface of the wavelength conversion member 20 (that is, a first surface 20a of the wavelength conversion member 20) opposite to a surface on the support substrate 15 side (that is, a second surface 20b of the wavelength conversion member 20) or disposed inside the wavelength conversion member 20, and overlapping one of the first light-emitting portion 11 and the second light-emitting portion 12 in plan view. In the light-emitting element 10, the emission intensity of the first light at a light emission peak wavelength of the second light is lower than the emission intensity of the second light at the light emission peak wavelength of the second light, during light emission of the light-emitting device 100.

In one example, the light-emitting device 100 described below further includes a light guide member 40 covering side surfaces of the support substrate 15, a wiring substrate 50 provided with the light-emitting element 10, and a covering member 60 covering side surfaces of the light-emitting element 10 and side surfaces of the wavelength conversion member 20 via the light guide member 40.

Components of the light-emitting device 100 will be described below.

Light-Emitting Element

The light-emitting element 10 includes a plurality of light-emitting portions. Specifically, the light-emitting element 10 includes the support substrate 15, the first light-emitting portion 11 and the second light-emitting portion 12 disposed adjacent to each other on the second surface 15b of the support substrate 15, a first element electrode 16 disposed on the first light-emitting portion 11, and a second element electrode 17 disposed on the second light-emitting portion 12. The first light is emitted from the first light-emitting portion 11 of the light-emitting element 10, and the second light is emitted from the second light-emitting portion 12 of the light-emitting element 10.

Examples of the support substrate 15 include an insulating substrate made of sapphire, spinel ($MgAl_2O_4$), or the like, and a nitride-based semiconductor substrate made of InN, AlN, GaN, InGaN, AlGaN, InGaAlN, or the like. Preferably, the support substrate 15 is made of a light-transmissive material in order to extract light emitted from the light-emitting portions through the support substrate 15.

Each of the first light-emitting portion 11 and the second light-emitting portion 12 includes a semiconductor layered body. The semiconductor layered body of the first light-emitting portion 11 includes a first semiconductor layer 111, a light-emitting layer 112, and a second semiconductor layer 113 disposed in this order on the support substrate 15. The semiconductor layered body of the second light-emitting portion 12 includes a first semiconductor layer 121, a light-emitting layer 122, and a second semiconductor layer 123 disposed in this order on the support substrate 15. A buffer layer made of AlGaN or the like may be provided between the support substrate 15 and the semiconductor layered bodies. The first light-emitting portion 11 and the second light-emitting portion 12 are disposed adjacent to each other with a gap therebetween on the second surface 15b of the support substrate 15. The first light-emitting portion 11 and the second light-emitting portion 12 are each provided, on the semiconductor layered body side, with an element electrode for feeding power from the outside. On the first light-emitting portion 11, three element electrodes of an N-side electrode 161, a P-side electrode 162, and an N-side electrode 163 are disposed as the first element electrode 16. Similarly, on the second light-emitting portion 12, three element electrodes of an N-side electrode 171, a P-side electrode 172, and an N-side electrode 173 are disposed as the second element electrode 17. In the light-emitting element 10, the first light-emitting portion 11 and the second light-emitting portion 12 are spaced apart and electrically independent from each other. Therefore, the first light-emitting portion 11 and the second light-emitting portion 12 can be driven individually by being fed with power via the first element electrode 16 and the second element electrode 17, respectively.

For the first light-emitting portion 11 and the second light-emitting portion 12, materials that emit light with any wavelength can be selected according to the application. For example, the first light-emitting portion 11 and/or the second light-emitting portion 12 that emit blue light (for example, with a wavelength in a range from 430 nm to 500 nm) and green light (for example, with a wavelength in a range from 500 nm to 570 nm) can use the semiconductor layered body formed using a nitride-based semiconductor ($In_XAl_Y Ga_{1-X-Y}N$, $0 \leq X$, $0 \leq Y$, $X+Y \leq 1$), GaP, or the like. The first light-emitting portion 11 and/or the second light-emitting portion 12 that emit red light (for example, with a wavelength in a range from 610 nm to 700 nm) can use the semiconductor layered body formed using GaAlAs, AlInGaP, or the like as well as the nitride-based semiconductor element. The first light-emitting portion 11 and the second light-emitting portion 12 may have the same semiconductor layered body structure or different semiconductor layered body structures.

During light emission of the light-emitting device 100, the first light and the second light with different emission intensities can be emitted from the first light-emitting portion 11 and the second light-emitting portion 12, respectively, in the light-emitting element 10.

An example of the light-emitting element including the first light-emitting portion 11 and the second light-emitting portion 12 having different light emission intensities during light emission is the light-emitting element 10 including the first light-emitting portion 11 and the second light-emitting portion 12 including different semiconductor layered bodies. Even when the first light-emitting portion 11 and the second light-emitting portion 12 include the same semiconductor layered body in the light-emitting element 10, current densities of an electric current passing through the light-emitting layer 112 of the first light-emitting portion 11 and an electric current passing through the light-emitting layer 122 of the second light-emitting portion 12 are made to be different from each other, whereby light emission intensities of the first light-emitting portion 11 and the second light-emitting portion 12 during light emission of the light-emitting device 100 can be different from each other. Here, in the light-emitting element 10, the first light-emitting portion 11 and the second light-emitting portion 12 include the same semiconductor layered body structure. The light-emitting element 10 receives power during light emission of the light-emitting device 100 such that the current density of the electric current passing through the light-emitting layer 122 of the second light-emitting portion 12 is higher than the current density of the electric current passing through the light-emitting layer 112 of the first light-emitting portion 11.

The first light-emitting portion 11 emits first light. The second light-emitting portion 12 emits second light having an emission intensity at a light emission peak wavelength different from that of the first light. In the light-emitting element 10, the emission intensity of the first light at a light emission peak wavelength of the second light is lower than the emission intensity of the second light at the light emission peak wavelength of the second light, during light emission of the light-emitting device 100. For example, when the light emission peak wavelength of the second light is 439 nm, the emission intensity of the first light is lower than the emission intensity of the second light at a wavelength of 439 nm. Different emission intensities of the first light and the second light can provide a difference in luminance between the first light-emitting portion 11 side and the second light-emitting portion 12 side of the light-emitting surface of the light-emitting device 100. Therefore, in using the light-emitting device 100 as, for example, a light source for an automobile headlight, the luminance can be adjusted according to the irradiation area of the headlight, even with a relatively simple optical system configuration. In the light-emitting device 100, the first light and the second light have different emission intensities during light emission. The emission intensities of the first light and the second light at a light emission peak wavelength of the second light during light emission of the light-emitting device 100 are different from each other. However, during light emission of the light-emitting device 100, that is, when the first light-emitting portion 11 and the second light-emitting portion 12 emit light simultaneously, the light emission peak wavelength of the first light and the light emission peak wavelength of the second light partially overlap, making it difficult to see the difference in emission intensity between the first light and the second light at the light emission peak wavelength of the second light in the emission spectrum of the light-emitting device 100. In this case, the difference between the emission intensity of the first light at the light emission peak wavelength of the second light and the emission intensity of the second light at the light emission peak wavelength of the second light can be seen by causing the first light-emitting portion 11 and the second light-emitting portion 12 to emit light individually.

In the light-emitting device 100, one light-emitting element includes the first light-emitting portion 11 and the second light-emitting portion 12 that emit light having different light emission intensities. This achieves miniaturization of the light-emitting device 100 compared to a light-emitting device including a plurality of light-emitting elements 10 combined to provide a luminance difference on the light-emitting surface. For example, when the light-emitting device 100 is used as a light source of an automobile headlight, the optical components such as a lens, a reflector, and the like can be reduced in size by making the light-emitting surface smaller; thus, a more compact headlight can be achieved and the degree of design freedom can be improved.

The light emission peak wavelength of the first and second light during light emission is, for example, in a range from 420 nm to 460 nm. The emission spectra of the first light and the second light partially overlap each other, but the light emission peak wavelengths thereof are different. The difference between the light emission peak wavelengths of the first light and the second light during light emission is preferably in a range from 0.1 nm to 15 nm. With a difference in the light emission peak wavelength being 0.1 nm or more, it is easier to provide a difference in luminance. On the other hand, when the difference between the light emission peak wavelengths is equal to or less than 15 nm, uneven chromaticity on the light-emitting surface of the light-emitting device 100 during light emission can be more easily suppressed by the light adjustment member 30 described later. In the light-emitting device 100, when the emission intensity of the second light during light emission is 100, the emission intensity of the first light is, for example, in a range from 0 to 80, and preferably in a range from 10 to 70. When the emission intensity of the first light is equal to or higher than 10, the difference in chromaticity on the light-emitting surface of the light-emitting device 100 can be more easily controlled. On the other hand, with an emission intensity of the first light being equal to or less than 70, it is easier to provide a difference in luminance on the light-emitting surface.

The first light-emitting portion 11 and the second light-emitting portion 12 have the same area in plan view. The first light-emitting portion 11 and the second light-emitting portion 12 have different current densities during light emission. With different current densities of the first light-emitting portion 11 and the second light-emitting portion 12 during light emission in the light-emitting device 100, the light emission intensities of the first light and the second light are different from each other.

As will be described later, the current densities of the first light-emitting portion 11 and the second light-emitting portion 12 during light emission can be different by individually driving the first light-emitting portion 11 and the second light-emitting portion 12 via a wiring 52 of the wiring substrate 50.

In the light-emitting device 100, there is a difference in luminance between the first light-emitting portion 11 side and the second light-emitting portion 12 side on the light-emitting surface of the light-emitting device 100.

Here, during light emission of the light-emitting device 100, the current density of the first light-emitting portion 11 is lower than the current density of the second light-emitting portion 12. This makes the emission intensity of the second light emitted from the second light-emitting portion 12 higher than the emission intensity of the first light emitted from the first light-emitting portion 11. Therefore, it is easier for the light-emitting device 100 to have a difference in luminance. Specifically, the current density during light emission of the first light-emitting portion 11 is in a range from $0$ A/m$^2$ to $1.9\times10^6$ A/m$^2$, and the current density during light emission of the second light-emitting portion 12 is higher than the current density during light emission of the first light-emitting portion 11 and in a range from $1.7\times10^6$ A/m$^2$ to $2.8\times10^6$ A/m$^2$.

Wavelength Conversion Member

The light-emitting device 100 includes the wavelength conversion member 20 disposed on the first surface 15a of the support substrate 15 and containing a phosphor that performs wavelength conversion of the first light emitted from the first light-emitting portion 11 and the second light emitted from the second light-emitting portion 12 into the third light.

The wavelength conversion member 20 converts the wavelength of at least a part of light from the light-emitting element 10 into a different wavelength. In one example, the wavelength conversion member 20 as used herein has a plate shape and is rectangular in plan view. The wavelength conversion member 20 contains a phosphor that performs wavelength conversion of the first light and the second light into the third light having a light emission peak wavelength different from that of the first light and the second light. The light emission peak wavelength of the third light is in a range from 500 nm to 600 nm.

The wavelength conversion member 20 includes a wavelength conversion layer 21 containing a phosphor and a light-transmissive member 22 supporting the wavelength conversion layer 21, and the wavelength conversion layer 21 is disposed facing the first surface 15a of the support substrate 15. The wavelength conversion member 20 has a surface larger than the first surface 15a of the support substrate 15, and this surface is bonded to the first surface 15a of the support substrate 15. That is, the outer edge of the wavelength conversion member 20 is on the outer side of the outer edge of the light-emitting element 10 in plan view.

The wavelength conversion layer 21 can be formed by mixing a phosphor and a light-transmissive material, such as a resin, glass, an inorganic material, or the like, as a binder, and molding the mixture. For example, as the light-transmissive material, an organic resin material such as an epoxy resin, a silicone resin, a phenol resin, or a polyimide resin, as well as an inorganic material such as glass or a ceramic can be used.

As the phosphor, one that can be excited by the first light and the second light emitted from the first light-emitting portion 11 and the second light-emitting portion 12, respectively, can be used.

Examples of a phosphor that emits green light include an yttrium-aluminum-garnet-based phosphor (for example, $Y_3(Al,Ga)_5O_{12}$:Ce), a lutetium-aluminum-garnet-based phosphor (for example, $Lu_3(Al,Ga)_5O_{12}$:Ce), a terbium-aluminum-garnet-based phosphor (for example, $Tb_3(Al, Ga)_5 O_{12}$:Ce), a silicate-based phosphor (for example, $(Ba, Sr)_2SiO_4$:Eu), a chlorosilicate-based phosphor (for example, $Ca_8Mg(SiO_4)_4Cl_2$:Eu), a β-sialon-based phosphor (for example, $Si_{6-z}Al_zO_zN_{8-z}$:Eu (0<z<4.2)), and an SGS-based phosphor (for example, $SrGa_2S_4$:Eu).

Examples of a phosphor that emits yellow light include an α-sialon-based phosphor (for example, $Mz(Si,Al)_{12}(O,N)_{16}$ (where 0<z≤2, and M is Li, Mg, Ca, or Y, and a lanthanide element excluding La and Ce). In addition, the above phosphors that emit green light include a phosphor that emits yellow light. For example, when Y is partially substituted with Gd in the yttrium aluminum garnet-based phosphor, a light emission peak wavelength can be shifted to a long wavelength side, and thus, the yttrium aluminum garnet-based phosphor can emit yellow light. Further, the above phosphors include a phosphor that can emit orange light.

Examples of a phosphor that emits red light include a nitrogen-containing calcium aluminosilicate (CASN or SCASN)-based phosphor (for example, $(Sr,Ca)AlSiN_3$:Eu) and a BSESN-based phosphor (for example, $(Ba,Sr,Ca)_2Si_5N_8$:Eu). Other examples include a manganese-activated fluoride-based phosphor (a phosphor represented by a general formula (I) $A_2[M_{1-a}Mn_aF_6]$ (where, in the general formula (I), A is at least one kind of element selected from the group consisting of K, Li, Na, Rb, Cs, and $NH_4$, M is at least one kind of element selected from the group consisting of Group 4 elements and Group 14 elements, and a satisfies 0<a<0.2)). Examples of the manganese-activated fluoride-based phosphor include a KSF-based phosphor (for example, $K_2SiF_6$:Mn), a KSAF-based phosphor (for example, $K_2Si_{0.99}Al_{0.01}F_{5.99}$:Mn), and an MGF-based phosphor (for example, $3.5MgO_{0.5}MgF_2GeO_2$:Mn).

For example, an yttrium-aluminum-garnet-based phosphor (for example, $(Y,Gd)_3Al_5O_{12}$:Ce) in which Y is partially substituted with Gd can be preferably used as a yellow light-emitting phosphor that can emit white mixed-color light in combination with a blue light-emitting element. To obtain the light-emitting device 100 that can emit white light, the kind and concentration of the phosphor that is contained in the wavelength conversion layer 21 are adjusted such that the light-emitting device 100 can emit white light of a desired chromaticity rank.

The phosphor concentration of the wavelength conversion layer 21 is preferably set in accordance with the first light having a low emission intensity that is emitted from the first light-emitting portion 11. Specifically, it is preferably set in accordance with the peak wavelength of the first light during light emission. For example, the type, particle size, and concentration of the phosphor to be contained are determined in accordance with the peak wavelength of the first light that is emitted with a desired emission intensity, in consideration of, for example, a wavelength conversion efficiency with which the phosphor is excited at the peak wavelength, an emission wavelength, and the like. Preferably, the phosphor concentration of the wavelength conversion layer 21 is, for example, in a range from 50 mass % to 60 mass %. The phosphor concentration refers to the proportion of the phosphor in the wavelength conversion layer 21 containing the phosphor. The phosphor concentration of the wavelength conversion layer 21 is lower than the phosphor concentration of the light adjustment member 30, which will be described later.

The light-transmissive member 22 is made of, for example, a light-transmissive material such as a resin, glass, or an inorganic material molded into a plate shape. The light-transmissive member 22 has a size equivalent to that of the wavelength conversion layer 21 in plan view and is disposed such that its lower surface is in contact with the upper surface of the wavelength conversion layer 21. As for the glass, borosilicate glass, quartz glass, and the like, for example, can be used. As for the resin, a silicone resin, an epoxy resin, and the like, for example, can be used. In particular, it is preferable to use glass for the light-transmissive member 22 in consideration of its resistance to degradation by light, mechanical strength, and the like. The light-transmissive member 22 may contain a light diffusion member. With the light diffusion member contained in the light-transmissive member 22, uneven chromaticity and uneven luminance can be suppressed. As for the light diffusion member, titanium oxide, barium titanate, aluminum oxide, or silicon oxide, for example, can be used.

An example of the wavelength conversion member 20 is formed by disposing the wavelength conversion layer 21 by printing or the like on the light-transmissive member 22 made of a glass plate. Supported by the glass plate, the wavelength conversion layer 21 can be made thinner. This shortens the optical path length of light passing through the wavelength conversion layer 21 and suppresses light attenuation in the wavelength conversion layer 21, so that the light-emitting device 100 can have a higher luminance. In addition, disposing the glass on the light-emitting surface side of the light-emitting device 100 can reduce the surface unevenness of the light-transmissive member 22; thus, the light adjustment member 30 can be disposed easily.

The thickness of the wavelength conversion member 20 can be set, for example, in a range from 30 μm to 300 μm, preferably in a range from 60 μm to 200 μm, in consideration of the miniaturization of the light-emitting device 100, the mechanical strength of the wavelength conversion member 20, and the like. When the wavelength conversion member 20 includes the wavelength conversion layer 21 and the light-transmissive member 22, the thickness of the wavelength conversion layer 21 is preferably about 10% to 60% of the total thickness of the wavelength conversion member 20.

Light Adjustment Member

The light-emitting device 100 includes the light adjustment member 30 disposed on the surface 20a of the wavelength conversion member 20 (hereinafter referred to as the first surface 20a of the wavelength conversion member 20) opposite to the surface 20b of the wavelength conversion member 20 on the support substrate side (hereinafter referred to as the second surface 20b of the wavelength conversion member 20) or disposed inside the wavelength conversion member 20, and overlapping one of the first light-emitting portion 11 and the second light-emitting portion 12 in plan view.

The light adjustment member 30 absorbs at least part of the first light and the second light emitted from the light-emitting element 10, and performs wavelength conversion of the other part into light having a different wavelength. Here, the light adjustment member 30 is a wavelength conversion member containing a phosphor that performs wavelength conversion of the second light. For example, the phosphor performs wavelength conversion of the second light into fourth light having a light emission peak wavelength different from that of the second light. The third light and the fourth light obtained by wavelength conversion of the second light may have the same wavelength or different wavelengths. The third light and the fourth light can have different wavelengths, when, for example, different kinds of phosphors are contained in the wavelength conversion layer 21 and the light adjustment member 30. The light emission peak wavelength of the fourth light is in a range from 500 nm to 600 nm. The phosphor concentration of the light adjustment member 30 is, for example, in a range from 60 mass % to 70 mass %. The phosphor concentration refers to the proportion of the phosphor in the light adjustment member 30 containing the phosphor.

In the light-emitting device 100, the light adjustment member 30 may be disposed on the first surface 20a of the wavelength conversion member 20, or may be disposed inside the wavelength conversion member 20. In particular, the light adjustment member 30 is preferably disposed inside the wavelength conversion member 20. Specifically, the light adjustment member 30 is preferably disposed inside the wavelength conversion member 20 and on the surface of the light-transmissive member 22 on the wavelength conversion layer 21 side. In other words, the light adjustment member 30 is preferably disposed between the light-transmissive member 22 and the wavelength conversion layer 21. When the light adjustment member 30 is disposed between the light-transmissive member 22 and the wavelength conversion layer 21, a part of the side surface of the light adjustment member 30 may be exposed from the wavelength conversion layer 21, as illustrated in FIG. 1C. In that case, the light adjustment member 30 constitutes a part of the side surface of the wavelength conversion member 20. A part of the lower surface continuing to the side surface of the light adjustment member 30 that is included in the side surface of the wavelength conversion member 20 may be exposed from the wavelength conversion layer 21 and disposed on the second surface 20b of the wavelength conversion member 20. The light adjustment member 30 may be located inside the wavelength conversion member 20, and the entire surface thereof may be covered with the light-transmissive member 22 and the wavelength conversion layer 21.

When the light adjustment member 30 is disposed inside the wavelength conversion member 20, the thickness of a portion of the wavelength conversion layer 21 covering the light adjustment member 30 is preferably smaller than the thickness of a portion of the wavelength conversion layer 21 not covering the light adjustment member 30 by the thickness of the light adjustment member 30. That is, the wavelength conversion member 20 including the light adjustment member 30 preferably has a flat plate shape with a uniform thickness.

The light adjustment member 30 is disposed overlapping the second light-emitting portion 12 in plan view. When the light adjustment member 30 is disposed overlapping, in plan view, the second light-emitting portion 12 that emits the second light, the light adjustment member 30 can perform wavelength conversion, into the fourth light, of the second light that is emitted from the second light-emitting portion 12 and not subjected to wavelength conversion by the wavelength conversion layer 21. In other words, the light adjustment member 30 can adjust the light amount of the second light emitted from the second light-emitting portion 12 side, thus reducing a difference in chromaticity of light emitted from the first light-emitting portion 11 side and light emitted from the second light-emitting portion 12 side. This allows the light-emitting device 100 to improve uneven chromaticity of the emission color on the light-emitting surface.

The light adjustment member 30 is preferably disposed overlapping the entire second light-emitting portion 12 in plan view. This further facilitates wavelength conversion of the second light emitted from the second light-emitting portion 12 by the light adjustment member 30. However, the light adjustment member 30 may include a portion not overlapping the second light-emitting portion 12 in plan view as long as the effect of adjusting the chromaticity to a desired chromaticity can be achieved. Preferably, the light adjustment member 30 is disposed overlapping the second light-emitting portion 12 in plan view, and extends to a position near the center of a portion between the first light-emitting portion 11 and the second light-emitting portion 12. This further facilitates wavelength conversion of the second light emitted from the second light-emitting portion 12 by the light adjustment member 30.

The ratio of the phosphor concentration (low concentration) of the wavelength conversion layer 21 to the phosphor concentration (high concentration) of the light adjustment member 30 is preferably about 100 (low concentration): 101 to 120 (high concentration) when the emission intensity ratio between weak emission and strong emission of the light-emitting portions is 1 to 20:100, for example.

Specifically, when a current value difference between the light-emitting portions is 0.1 A (weak emission): 1 A (strong emission), a difference between the peak wavelengths is +2.1 nm (weak emission): 0 nm (strong emission), and a difference in chromaticity y is about +0.015:0. When the phosphor concentration is increased by 8 mass %, the chromaticity y changes by about +0.018. Therefore, the phosphor concentration ratio is preferably set to about 100 (low concentration): 108 (high concentration).

For the light adjustment member 30, a material similar to the materials for the wavelength conversion layer 21 that are described as examples can be used. The phosphor contained in the wavelength conversion layer 21 and the phosphor contained in the light adjustment member 30 may be of the same kind. As used herein, "the same kind" includes, for example, a case in which the emission color is the same, a case in which the composition is the same, and a case in which the crystal structure is the same (for example, a case in which the phosphors are YAG-based phosphors and have the same garnet structure). The phosphor contained in the wavelength conversion layer 21 and the phosphor contained in the light adjustment member 30 may be of different kinds. Phosphors having different emission colors can be contained to adjust the color of light emitted from the light-emitting device 100. For example, white light and amber light can be emitted when the wavelength conversion layer 21 contains a yellow phosphor and the light adjustment member 30 contains a red phosphor.

Light Guide Member

The light-emitting device 100 may include the light guide member 40 that covers the side surfaces of the light-emitting element 10.

The light guide member 40 is a member that guides light from the light-emitting element 10 to the wavelength conversion member 20. The light guide member 40 covers the side surfaces of the support substrate 15. The light guide member 40 may be made of, for example, an adhesive member that bonds the light-emitting element 10 and the wavelength conversion member 20 and extends to the side surfaces of the support substrate 15. In this case, the light guide member 40 may be disposed with a predetermined thickness between the support substrate 15 and the wavelength conversion member 20. The light guide member 40 may be a member different from the adhesive member bonding the light-emitting element 10 and the wavelength conversion member 20.

In one example, the light guide member 40 has a curved side surface in a cross-sectional view. The light guide member 40 may be shaped with sloping side surfaces in cross-sectional view such that the width of the light guide member 40 increases from the second surface 15b side of the support substrate 15 toward the second surface 20b side of the wavelength conversion member 20. The cross-sectional shape of the side surface of the light guide member 40 may be straight or curved. For example, when the side surface of the light guide member 40 in cross-sectional view has a curved shape, the curved shape may be recessed toward the covering member 60, which will be described later, or toward the support substrate 15. Furthermore, the curved shape may include a portion recessed toward the covering member 60 and a portion recessed toward the support substrate 15.

For example, a light-transmissive resin can be employed for the light guide member 40. The light guide member 40 may be made of an organic resin such as an epoxy resin, a silicone resin, a phenolic resin, or a polyimide resin. In particular, a silicone resin, which has a high heat resistance, is preferably employed. The above-described light diffusion member or phosphor can also be contained in the light guide member 40.

Wiring Substrate

In the light-emitting device 100, the light-emitting element 10 can be disposed on the wiring substrate 50.

The wiring substrate 50 includes a base body 51 and the wiring 52 that is disposed on an upper surface of the base body 51 and feeds power to the first element electrode 16 and the second element electrode 17 of the light-emitting element 10 via a conductive member 70. The first element electrode 16 and the second element electrode 17 are disposed over the wiring 52 with the conductive member 70 therebetween. The conductive member 70 can be formed using a metal material made of a conductive metal, such as Cu or Au, or an alloy of such a metal. The element electrodes of the light-emitting element 10 and the wiring 52 may be directly bonded to each other without the conductive member 70 interposed therebetween.

The wiring substrate 50 includes the wiring 52 that can individually drive the first light-emitting portion 11 and the second light-emitting portion 12. The wiring 52 includes, for example, a first wiring 521, a second wiring 522, and a third wiring 523 for driving the first light-emitting portion 11, and a fourth wiring 524, a fifth wiring 525, and a sixth wiring 526 for driving the second light-emitting portion 12. The first wiring 521 and the third wiring 523 are connected by a wire 53, and the fourth wiring 524 and the sixth wiring 526 are connected by a wire 54. The second wiring 522 and the third wiring 523 are provided with an electronic component 541 such as a protective element, and the fifth wiring 525 and the sixth wiring 526 are provided with an electronic component 542. With the wiring 52, the wiring substrate 50 can individually control the amount of electric current that is fed to the first light-emitting portion 11 and the amount of electric current that is fed to the second light-emitting portion 12.

For the base body 51, any material known in the art can be used as the base body that is included in the wiring substrate for supporting electronic components such as the light-emitting element. For example, an insulating material such as glass epoxy, a resin, or a ceramic, a semiconductor material such as silicon, and a conductive material such as copper can be used. In particular, a ceramic, which has high heat resistance and light resistance, can be preferably used. Examples of a ceramic include aluminum oxide, aluminum nitride, silicon nitride, LTCC, and the like. In addition, a composite material of such an insulating material, a semiconductor material, and a conductive material can also be used. In a case in which the base body 51 is formed using a semiconductor material or a conductive material, the wiring 52 can be disposed over the upper surface of the base body 51 with an insulating layer therebetween.

Examples of the material for the wiring 52 include metals such as Fe, Cu, Ni, Al, Ag, Au, Pt, Ti, W, and Pd, and alloys containing at least one kind of these metals.

Covering Member

The light-emitting device 100 can include the covering member 60 that covers the light-emitting element 10 and the wavelength conversion member 20.

The covering member 60 is disposed covering the side surfaces of the first element electrode 16 and the second element electrode 17 and the side surfaces of the wavelength conversion member 20. In a case in which the light-emitting device 100 includes the light guide member 40, the covering member 60 covers the side surfaces of the light-emitting element 10 via the light guide member 40. In a case in which the light-emitting element 10 is disposed on the wiring substrate 50, the covering member 60 may cover the upper surface of the wiring substrate 50.

Preferably, the covering member 60 has a light-blocking property, specifically, a light reflective property and/or a light absorbing property. In particular, a material that can reflect light emitted from the light-emitting element 10 is preferably contained in the covering member 60. For example, the material preferably has a reflectance of 60% or more, more preferably 70% or more, 80% or more, or 90% or more with respect to the first light and the second light emitted from the light-emitting element 10. Preferably, the covering member 60 is formed using an insulating material. For example, a thermosetting resin, a thermoplastic resin, or the like can be used for the covering member 60. Specifically, an example of the covering member 60 is a resin containing particles of a light reflective substance. Examples of a resin include a resin containing at least one of a silicone resin, a modified silicone resin, an epoxy resin, a modified epoxy resin, an acrylic resin, a phenol resin, a bismaleimide triazine resin, and a polyphthalamide resin, and a hybrid resin thereof. Among these materials, it is preferable to use a resin containing, as a base polymer, a silicone resin, which exhibits a good heat resistance property and electrically insulating property and has flexibility. Examples of the light reflective material include titanium oxide, silicon oxide, zirconium oxide, magnesium oxide, calcium carbonate, calcium hydroxide, calcium silicate, zinc oxide, barium titanate, potassium titanate, aluminum oxide, aluminum nitride, boron nitride, and mullite, and a combination thereof. Among these materials, titanium oxide is preferable because it is relatively stable with respect to moisture or the like and has a high refractive index.

Operation of Light-Emitting Device

Upon activation of the light-emitting device 100, an electric current is fed from an external power source to the light-emitting element 10, and the light-emitting element 10 emits light. At least a part of each of the first light and the second light emitted from the light-emitting element 10 is subjected to wavelength conversion into the third light by the wavelength conversion member 20. The third light is mixed with the first light and the second light that are not subjected to wavelength conversion into the third light, and is emitted to the outside as, for example, white light. Light traveling in a lateral direction from the light-emitting element 10 is reflected by the covering member 60, enters the wavelength conversion member 20, and is emitted to the outside. At this time, the emission intensities of the first light and the second light are different, and the phosphor concentration of the wavelength conversion layer 21 is set in accordance with the first light having a low emission intensity that is emitted from the first light-emitting portion 11, as described above. In other words, the phosphor concentration of the wavelength conversion layer 21 is lower than the phosphor concentration set in accordance with the second light such that a desired white color can be achieved. This increases the proportion of the second light that is not converted into the third light by the wavelength conversion layer 21. Since the light adjustment member 30 is disposed overlapping the second light-emitting portion 12 in plan view, the second light that is emitted from the second light-emitting portion 12 side and not converted into the third light by the wavelength conversion layer 21 can be subjected to wavelength conversion by the light adjustment member 30. This can reduce a difference in chromaticity between light emitted from the first light-emitting portion 11 side and light emitted from the second light-emitting portion 12 side, improving uneven chromaticity on the light-emitting surface of the light-emitting device 100.

By referring to FIGS. 2A and 2B, improvement of uneven chromaticity of the emission color by the light adjustment member 30 will be specifically described below. For the sake of simplicity of the description, only some optical paths are schematically illustrated in FIGS. 2A and 2B. Although the traveling direction of the actual light appropriately changes due to refraction, scattering, or the like between and inside the members, illustration thereof may be omitted for simplicity.

The light emission peak wavelength of light that is emitted from the light-emitting layer is shifted according to the magnitude of the value of electric current flowing through the light-emitting layer. For example, the light emission peak wavelength is shifted to the short wavelength side in response an increase in the current value. Therefore, even when the same semiconductor layered body is used for the first light-emitting portion 11 and the second light-emitting portion 12, different values of electric current fed to the first light-emitting portion 11 and the second light-emitting portion 12 cause a difference in excitation efficiency of the phosphor due to different light emission peak wavelengths, thus causing a difference in chromaticity of the emission color.

For the light emission peak wavelengths of the first light and the second light (for example, blue light) emitted from the first light-emitting portion 11 and the second light-emitting portion 12, respectively, the light emission peak wavelength of first light L1B1 having a low emission intensity is longer than that of second light L2B1 having a high emission intensity, for example. In this case, for the light emission peak wavelengths of light (for example, yellow light) obtained by wavelength conversion of the first light and the second light by the wavelength conversion layer 21, for example, the light emission peak wavelength of third light L1Y11 obtained by wavelength conversion of the first light L1B1 is longer than that of third light L2Y11 obtained by wavelength conversion of the second light L2B1. The phosphor concentration of the wavelength conversion layer 21 is set in accordance with the first light L1B1 having a low emission intensity that is emitted from the first light-emitting portion 11. Therefore, the phosphor concentration is low for the second light L2B1, causing a large part of the second light L2B1 to be transmitted through the wavelength conversion layer 21 without wavelength conversion.

Since the light adjustment member 30 is disposed overlapping the second light-emitting portion 12 in plan view, on the second light-emitting portion 12 side, a part of the second light L2B1 traveling upward is subjected to wavelength conversion by the wavelength conversion layer 21 to become the third light L2Y11 and a part of the second light L2B1 is subjected to wavelength conversion by the light adjustment member 30 to become fourth light L2Y12 and the fourth light L2Y12 is emitted from the upper surface of the wavelength conversion member 20. A part of the third light L2Y11 is subjected to wavelength conversion by the light adjustment member 30 to become fourth light L2Y13 and the fourth light L2Y13 is emitted from the upper surface of the wavelength conversion member 20. A part of first light L1B2 emitted from the first light-emitting portion 11 and traveling obliquely upward to the second light-emitting portion 12 side is subjected to wavelength conversion by the wavelength conversion layer 21 to become third light L1Y21, and a part of the first light L1B2 is subjected to wavelength conversion by the light adjustment member 30 to become fourth light L1Y22 and the fourth light L1Y22 is emitted from the upper surface of the wavelength conversion member 20.

On the other hand, on the first light-emitting portion 11 side, a part of the first light L1B1 traveling upward is subjected to wavelength conversion by the wavelength conversion layer 21 to become the third light L1Y11 and the third light L1Y11 is emitted from the upper surface of the wavelength conversion member 20. A part of the second light L2B2 emitted from the second light-emitting portion 12 and traveling obliquely upward to the first light-emitting portion 11 side is subjected to wavelength conversion by the wavelength conversion layer 21 to become third light L2Y21 and the third light L2Y21 is emitted from the upper surface of the wavelength conversion member 20.

At this time, the third light L2Y11 obtained by wavelength conversion of the second light has a shorter wavelength (that is, closer to blue) than the third light L1Y11 obtained by wavelength conversion of the first light. Therefore, the chromaticity of light emitted from the second light-emitting portion 12 side is adjusted by wavelength conversion of the part of the second light L2B1 (blue light) into the fourth light L2Y12 by the light adjustment member 30. This reduces a difference in chromaticity between light emitted from the first light-emitting portion 11 side and light emitted from the second light-emitting portion 12 side, improving uneven chromaticity of white light having a luminance difference that is emitted from the light-emitting device 100.

Figure 3:
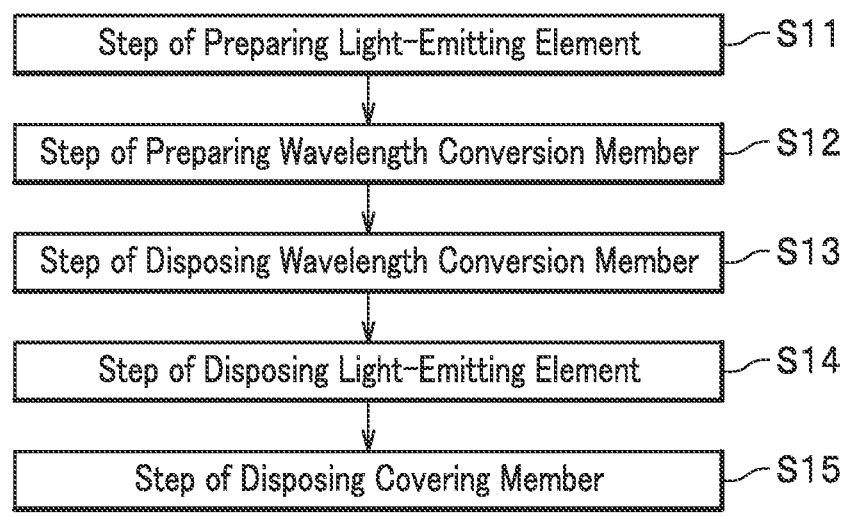
FIG. 3 is a flowchart of a method for manufacturing the light-emitting device according to the first embodiment.
Figure 4A:
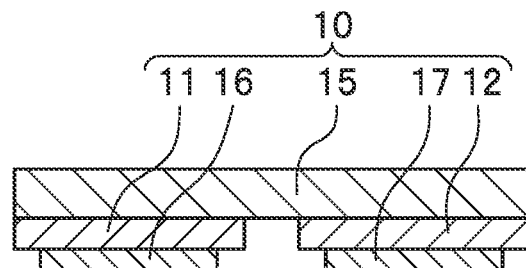
FIG. 4A is a schematic cross-sectional view illustrating an example of the method for manufacturing the light-emitting device according to the first embodiment.
Figure 4B:
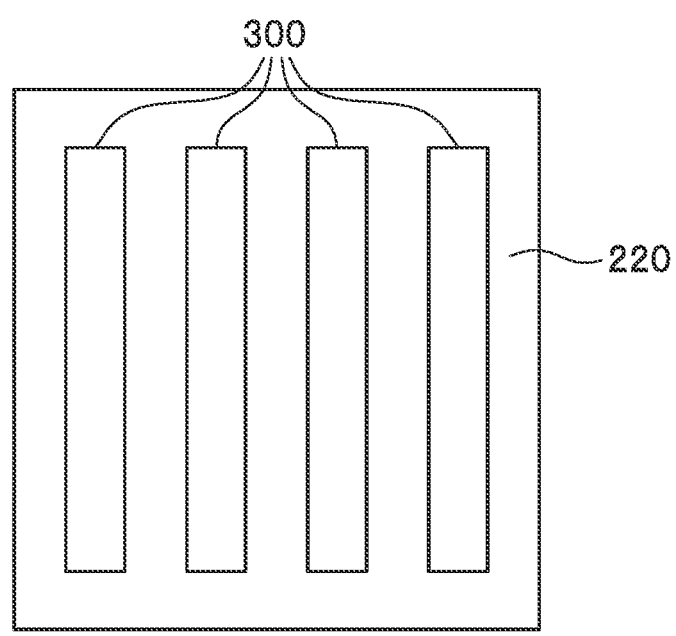
FIG. 4B is a schematic plan view illustrating an example of the method for manufacturing the light-emitting device according to the first embodiment.
Figure 4C:
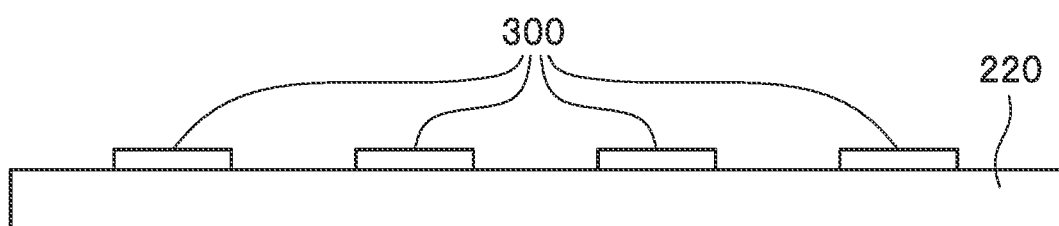
FIG. 4C is a schematic cross-sectional view illustrating an example of the method for manufacturing the light-emitting device according to the first embodiment.
Figure 4D:
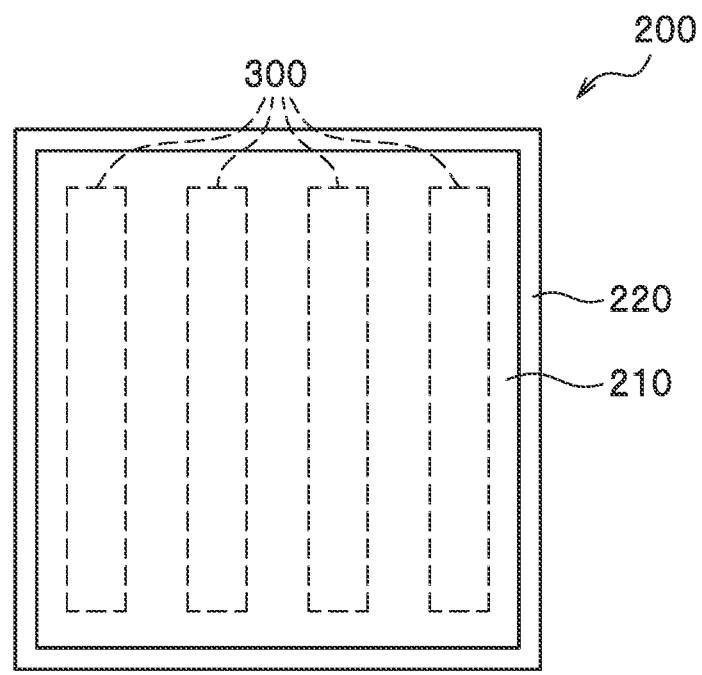
FIG. 4D is a schematic plan view illustrating an example of the method for manufacturing the light-emitting device according to the first embodiment.
Figure 4E:
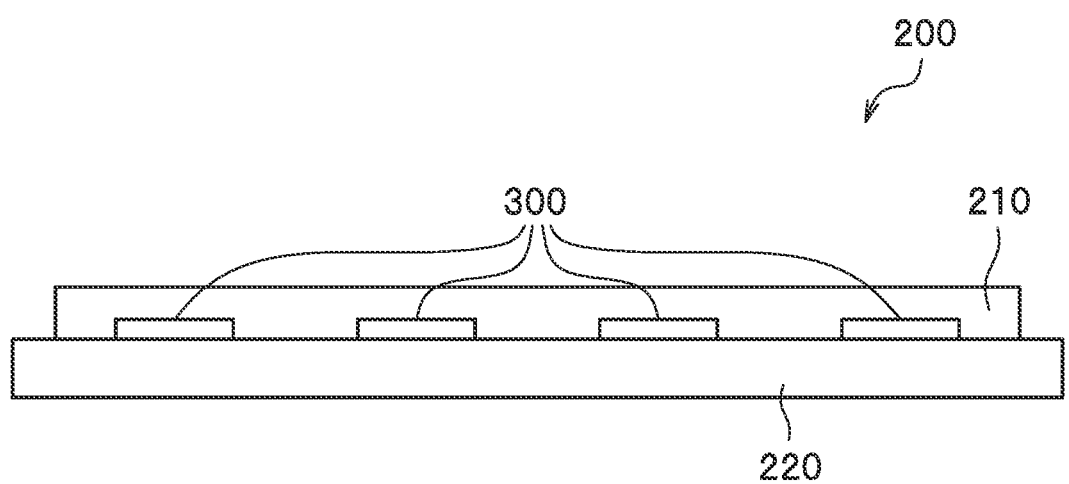
FIG. 4E is a schematic cross-sectional view illustrating an example of the method for manufacturing the light-emitting device according to the first embodiment.
Figure 4F:
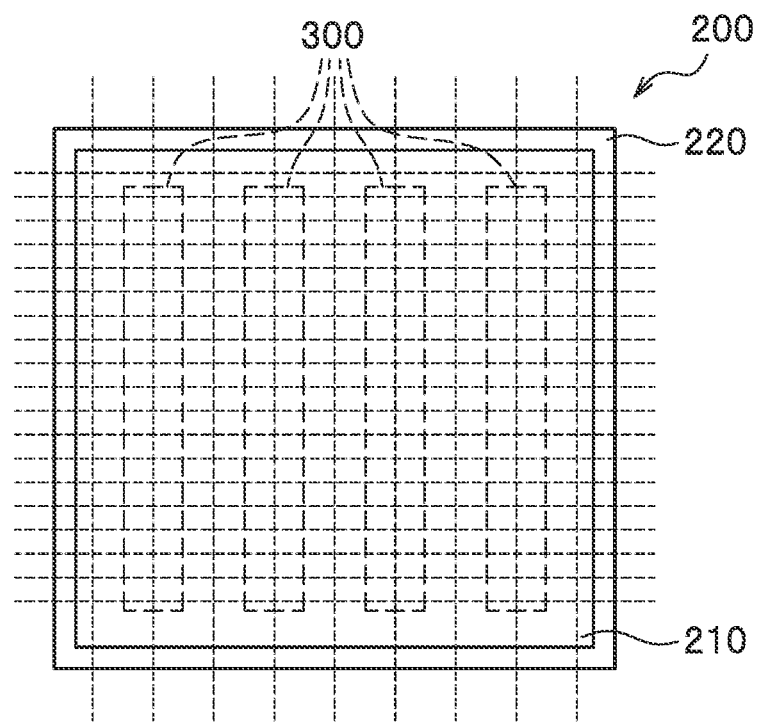
FIG. 4F is a schematic plan view illustrating an example of the method for manufacturing the light-emitting device according to the first embodiment.
Figure 4G:
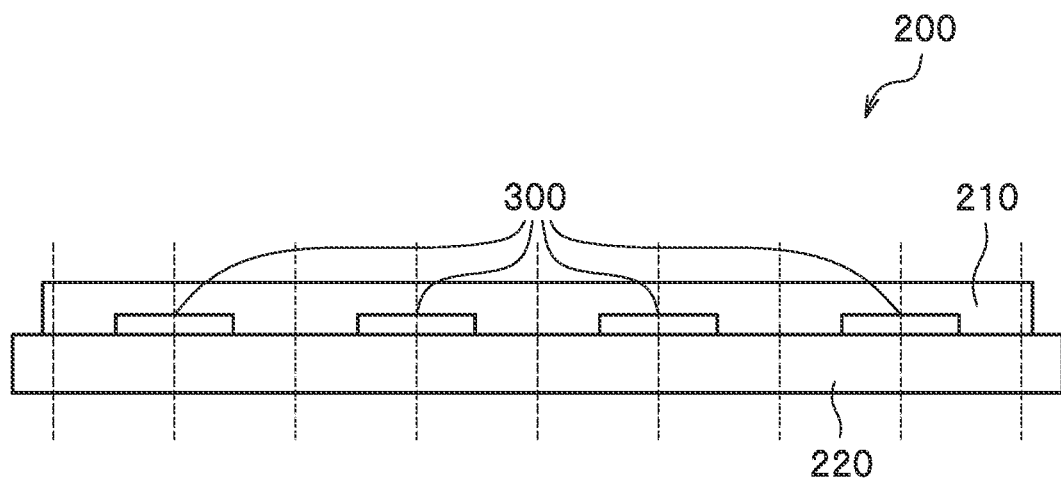
FIG. 4G is a schematic cross-sectional view illustrating an example of the method for manufacturing the light-emitting device according to the first embodiment.
Figure 4H:
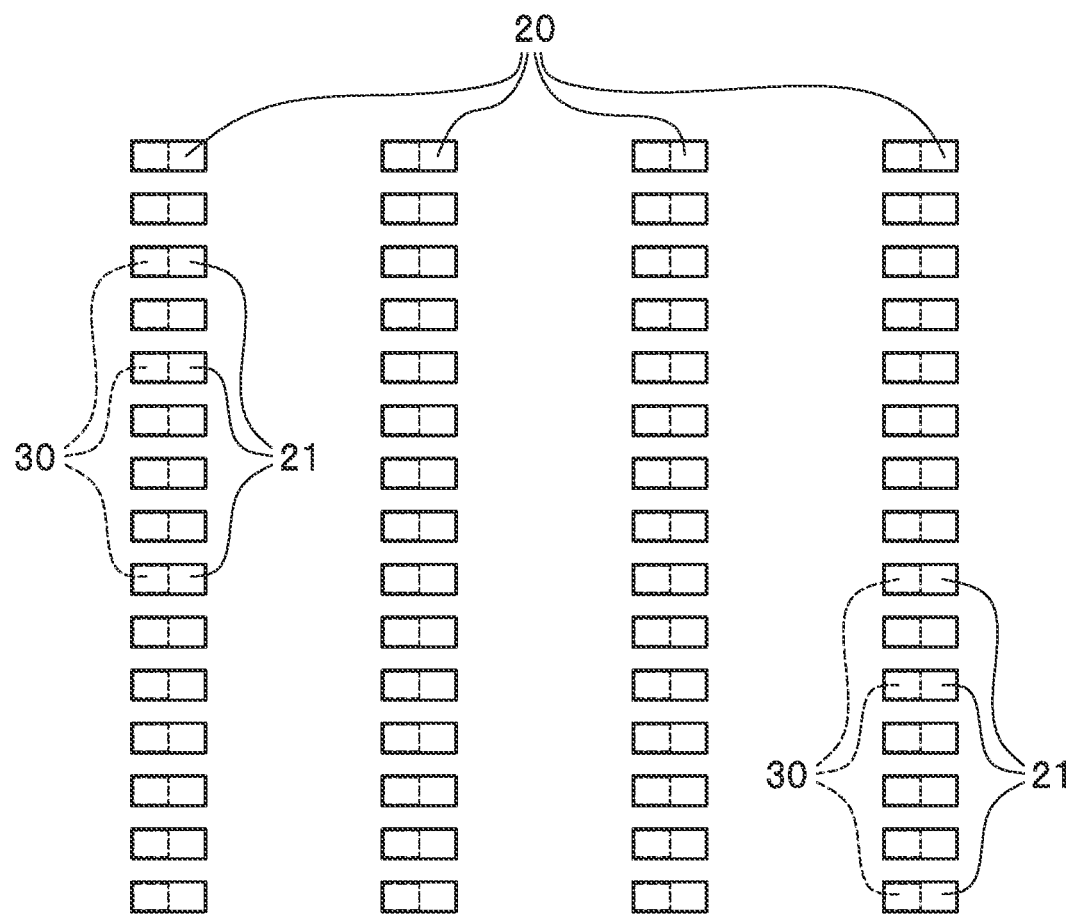
FIG. 4H is a schematic plan view illustrating an example of the method for manufacturing the light-emitting device according to the first embodiment.
Figure 4I:
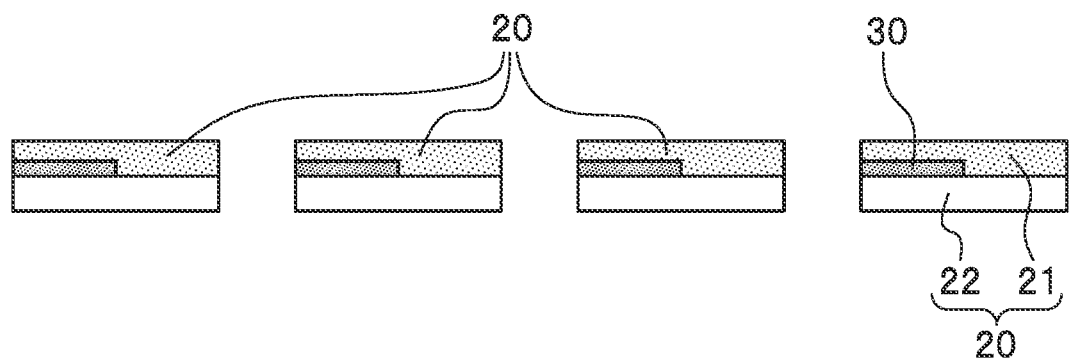
FIG. 4I is a schematic cross-sectional view illustrating an example of the method for manufacturing the light-emitting device according to the first embodiment.
Figure 4J:
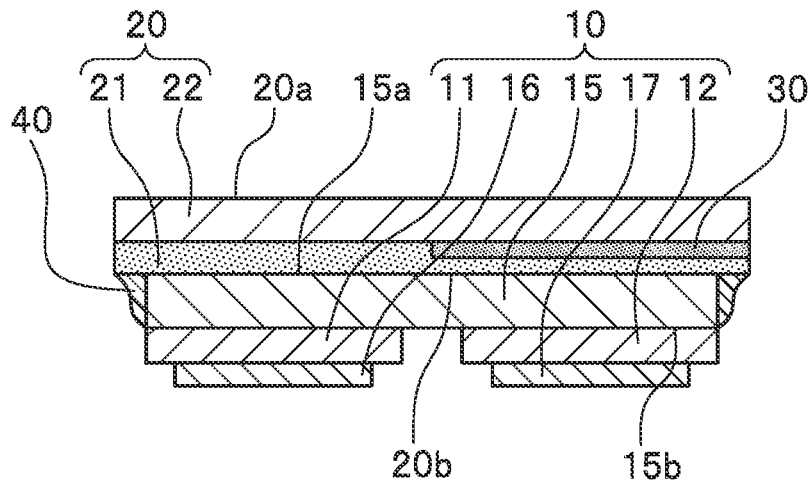
FIG. 4J is a schematic cross-sectional view illustrating an example of the method for manufacturing the light-emitting device according to the first embodiment.
Figure 4K:
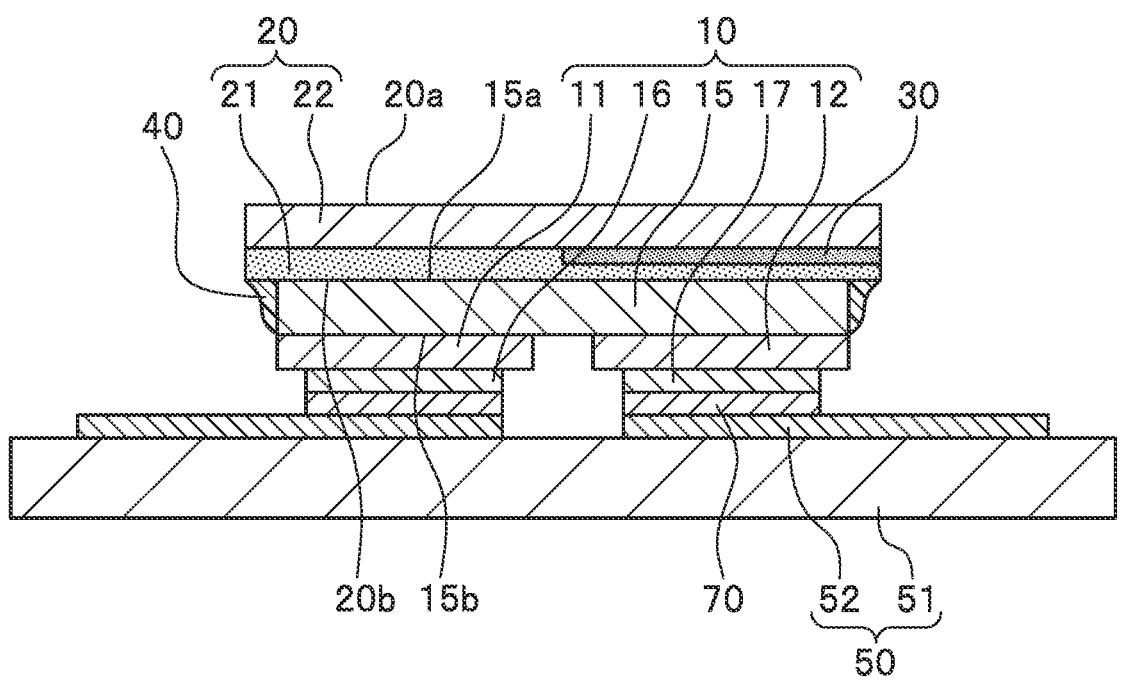
FIG. 4K is a schematic cross-sectional view illustrating an example of the method for manufacturing the light-emitting device according to the first embodiment.
Figure 4L:
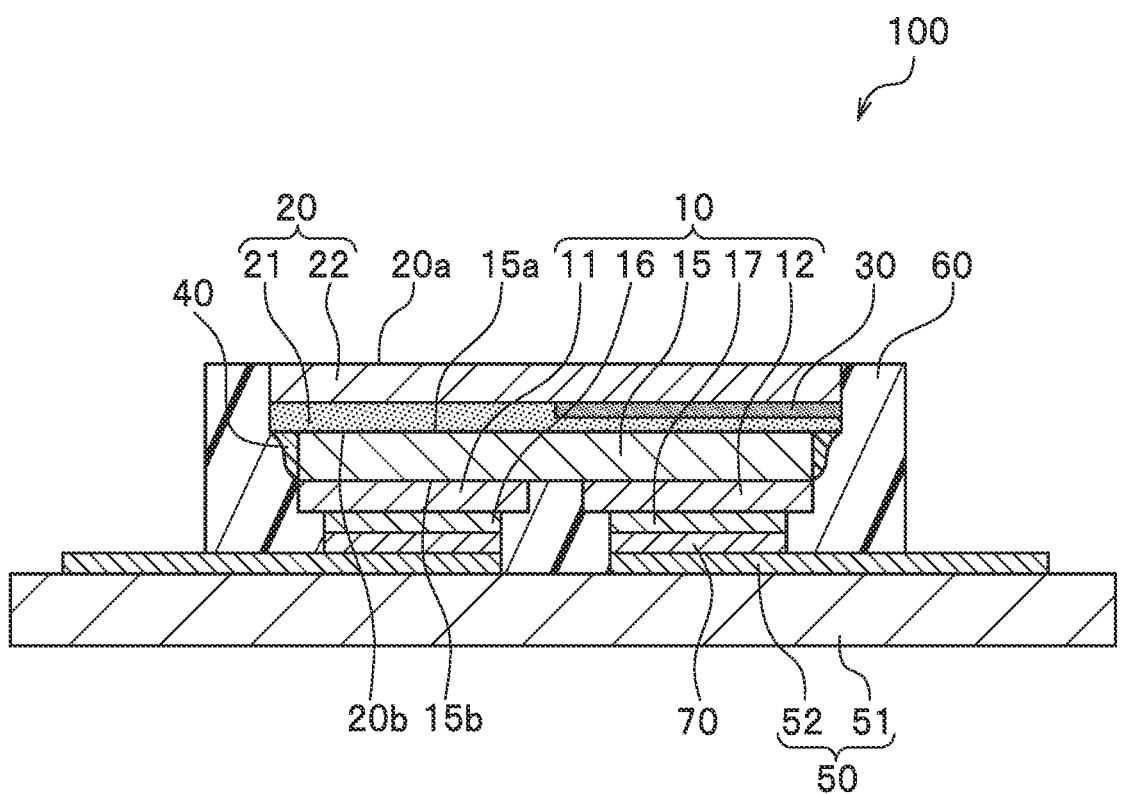
FIG. 4L is a schematic cross-sectional view illustrating an example of the method for manufacturing the light-emitting device according to the first embodiment.

Method for Manufacturing Light-Emitting Device FIG. 3 is a flowchart of a method for manufacturing the light-emitting device according to the first embodiment. FIGS. 4A, 4C, 4E, 4G, and 4I to 4L are schematic cross-sectional views illustrating the method for manufacturing the light-emitting device according to the first embodiment. FIGS. 4B, 4D, 4F, and 4H are schematic plan views illustrating an example of the method for manufacturing the light-emitting device according to the first embodiment.

A method for manufacturing the light-emitting device 100 includes a step of preparing the light-emitting element 10 including the support substrate 15 having the first surface 15a and the second surface 15b opposite to the first surface 15a, and the first light-emitting portion 11 and the second light-emitting portion 12 disposed adjacent to each other on the second surface 15b of the support substrate 15, the first light-emitting portion 11 including the semiconductor layered body including the first semiconductor layer 111, the light-emitting layer 112, and the second semiconductor layer 113 in this order and the second light-emitting portion 12 including the semiconductor layered body including the first semiconductor layer 121, the light-emitting layer 122, and the second semiconductor layer 123 in this order; a step of preparing the wavelength conversion member 20 having the first surface 20a and the second surface 20b opposite to the first surface 20a and containing a phosphor that performs wavelength conversion of the first light emitted from the first light-emitting portion 11 and the second light emitted from the second light-emitting portion 12 into third light, with the light adjustment member 30 disposed on the first surface 20a of the wavelength conversion member 20 or inside the wavelength conversion member 20; and a step of disposing the wavelength conversion member 20 provided with the light adjustment member 30 such that the second surface 20b of the wavelength conversion member 20 faces the first surface 15a of the support substrate 15. In the step of disposing the wavelength conversion member 20, the wavelength conversion member 20 is disposed on the light-emitting element 10 such that the light adjustment member 30 overlaps one of the first light-emitting portion 11 and the second light-emitting portion 12 in plan view.

The method for manufacturing the light-emitting device 100 is described which includes a step S11 of preparing the light-emitting element, a step S12 of preparing the wavelength conversion member, a step S13 of disposing the wavelength conversion member, a step S14 of disposing the light-emitting element, and a step S15 of disposing the covering member.

Note that the materials, arrangement, and the like of the members are as in the description of the light-emitting device 100, and thus descriptions thereof will be omitted as appropriate.

Step of Preparing Light-Emitting Element

The step S11 of preparing the light-emitting element is a step of preparing the light-emitting element 10 including the support substrate 15, the first light-emitting portion 11, the second light-emitting portion 12, the first element electrode 16, and the second element electrode 17.

Step of Preparing Wavelength Conversion Member

The step S12 of preparing the wavelength conversion member is a step of disposing the light adjustment member 30 on the surface on the wavelength conversion layer 21 side of the light-transmissive member 22 in the wavelength conversion member 20. The step S12 of preparing the wavelength conversion member includes a step of disposing light adjustment layers 300 on a light-transmissive plate 220 including regions to become individual light-transmissive members 22 after separation, such that the light adjustment layers 300 cover a part of the light-transmissive plate 220; a step of forming an intermediate 200 by disposing a wavelength conversion layer 210 on the light-transmissive plate 220 such that the wavelength conversion layer 210 covers the light adjustment layers 300 and the light-transmissive plate 220 exposed from the light adjustment layers 300; and a step of dividing the intermediate 200 to form the wavelength conversion members 20 each provided with the light adjustment member 30 on the surface of light-transmissive member 22 on the wavelength conversion layer 21 side.

Specifically, the light adjustment layers 300 that partially cover the upper surface of the light-transmissive plate 220 are first disposed on the light-transmissive plate 220 having a flat plate shape. The shapes, in plan view, of the light adjustment members 300 disposed on the light-transmissive plate 220 can be striped, dotted, island-like, or lattice-like, or various other shapes. Here, the plurality of light adjustment members 300 are arranged in a striped manner in plan view. Next, the wavelength conversion layer 210 is disposed on the light-transmissive plate 220 such that it covers the light adjustment layers 300 and the surface of the light-transmissive plate 220 that is exposed from the light adjustment layers 300. Preferably, all the light adjustment layers 300 are covered with the wavelength conversion layer 210. The intermediate 200 is formed in this manner. Then, the intermediate 200 is divided at desired positions to form the wavelength conversion members 20 inside each of which the light adjustment member 30 is disposed.

In the step S12 of preparing the wavelength conversion member, the arrangement, sizes, and the like of the members are adjusted such that, when the wavelength conversion member 20 is disposed on the first surface 15a of the support substrate 15, the light adjustment member 30 is disposed overlapping the second light-emitting portion 12 in plan view.

Although the intermediate 200 is divided to prepare, at a time, the plurality of wavelength conversion members 20 each provided with the light adjustment member 30, the wavelength conversion members 20 each provided with the light adjustment members 30 may be prepared individually. That is, the step S12 of preparing the wavelength conversion member may include a step of disposing the light adjustment member 30 on the light-transmissive member 22 such that the light adjustment member 30 partially covers the light-transmissive member 22; and a step of disposing the wavelength conversion layer 21 covering the light adjustment member 30 and the light-transmissive member 22 exposed from the light adjustment member 30. Alternatively, the wavelength conversion member 20 provided in advance with the light adjustment member 30 may be purchased, for example.

For the step S11 of preparing the light-emitting element and the step S12 of preparing the wavelength conversion member, either of the steps may be performed first, or both the steps may be performed in parallel.

Step of Disposing Wavelength Conversion Member

The step S13 of disposing the wavelength conversion member is a step of disposing the wavelength conversion member 20 provided with the light adjustment member 30, on the first surface 15a of the support substrate 15. In the step S13 of disposing the wavelength conversion member, the wavelength conversion member 20 including the wavelength conversion layer 21 containing the phosphor and the light-transmissive member 22 supporting the wavelength conversion layer 21 is disposed such that the surface on the wavelength conversion layer 21 side is located on the first surface 15a side of the support substrate 15. In the step S13 of disposing the wavelength conversion member, the wavelength conversion member 20 is disposed such that the light adjustment member 30 overlaps the second light-emitting portion 12 in plan view. The wavelength conversion member 20 is bonded to the support substrate 15 using, for example, an adhesive member. By adjusting the amount of the adhesive member, it is possible to extend the adhesive member provided between the support substrate 15 and the wavelength conversion member 20 to the side surfaces of the support substrate 15 to form the light guide member 40 made of the adhesive member on the side surfaces of the support substrate 15. The wavelength conversion member 20 may be bonded to the support substrate 15 by direct bonding instead of using the adhesive member.

Step of Disposing Light-Emitting Element

The step S14 of disposing the light-emitting element is a step of disposing the light-emitting element 10 on the wiring substrate 50. In the step S14 of disposing the light-emitting element, the light-emitting element 10 is disposed on the wiring substrate 50 by bonding the first element electrode 16 and the second element electrode 17 to the wiring 52 by using the conductive member 70.

Step of Disposing Covering Member

The step S15 of disposing the covering member is a step of disposing, on the wiring substrate 50, the covering member 60 covering the side surfaces of the first element electrode 16 and the second element electrode 17, the side surfaces of the light guide member 40, and the side surfaces of the wavelength conversion member 20.

In the step S15 of disposing the covering member, an uncured resin constituting the covering member 60 is disposed, on the wiring substrate 50, covering the entire side surfaces of the wavelength conversion member 20. To dispose the resin or the like, for example, the resin is fed on the upper side of the wiring substrate 50 that is fixed, by using a resin discharge device that can move (is movable) vertically, horizontally, or the like with respect to the wiring substrate 50. Alternatively, the resin can be disposed by compression molding, transfer molding, or the like. Subsequently, the resin is cured to form the covering member 60. The covering member 60 may be formed by disposing a frame such as a resin wall in advance at a desired position of the wiring substrate 50 and filling the inside of the frame with resin. The upper surface of the formed covering member 60 may be cut to adjust the height or may be flattened, as necessary.

In the method for manufacturing the light-emitting device 100, a plurality of light-emitting devices 100 may be manufactured simultaneously using a single wiring substrate including a plurality of continuous areas, each of which becomes the wiring substrate 50 of the corresponding light-emitting device 100 after separation, or may be manufactured individually. When simultaneously manufacturing the plurality of light-emitting devices 100, the separation step of separating the light-emitting devices 100 is performed after the step S15 of disposing the covering member, to form the light-emitting devices 100.

Next, other embodiments will be described. Note that the same reference signs are attached to the configurations that have been described above, and explanation thereof will be omitted as appropriate.

Second Embodiment

Figure 5A:
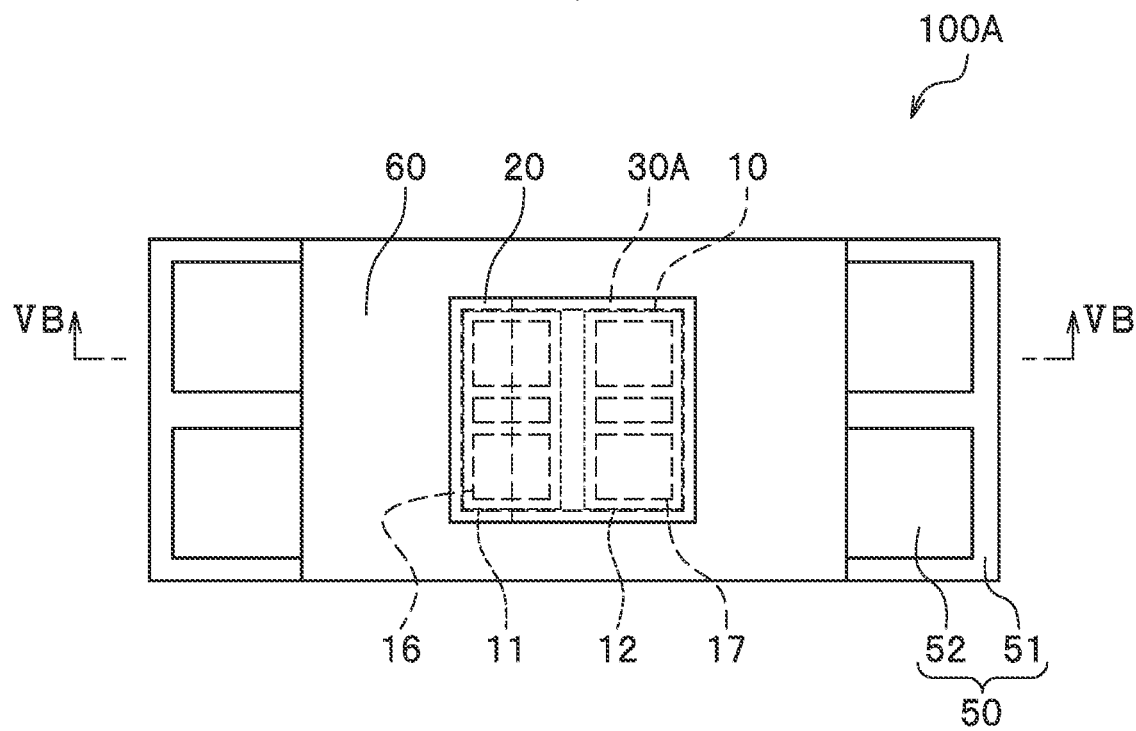
FIG. 5A is a schematic plan view illustrating an example of a light-emitting device according to a second embodiment.
Figure 5B:
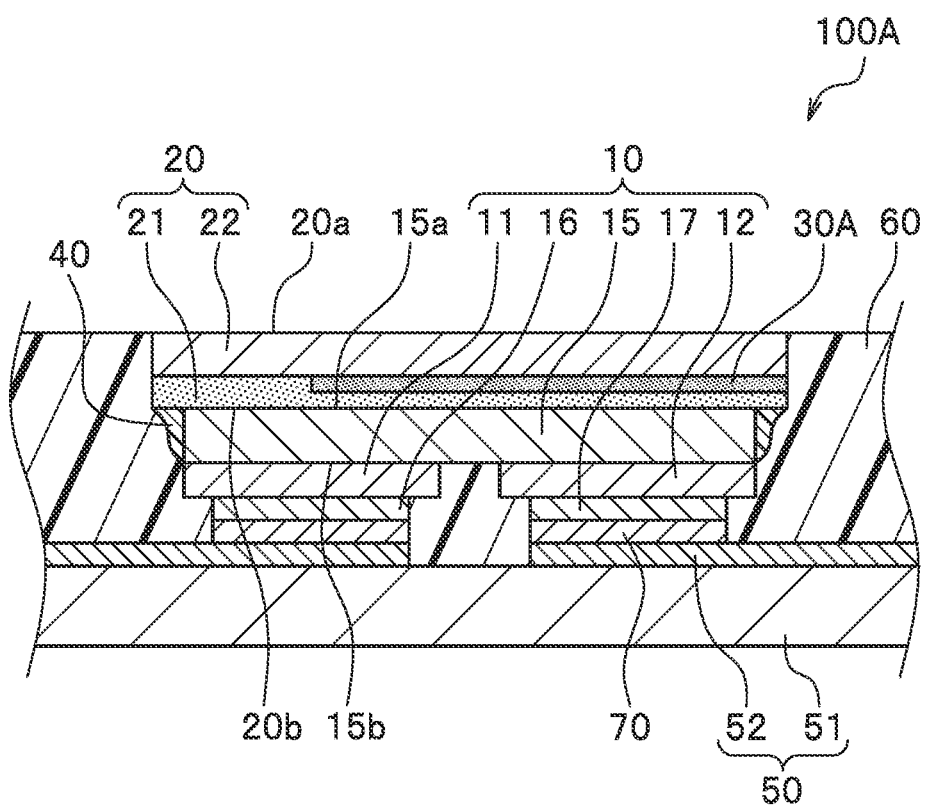
FIG. 5B is a schematic cross-sectional view taken along line VB-VB of FIG. 5A.

FIG. 5A is a schematic plan view illustrating an example of a light-emitting device according to a second embodiment. FIG. 5B is a schematic cross-sectional view taken along line VB-VB of FIG. 5A.

A light-emitting device 100A differs from the light-emitting device 100 according to the first embodiment in that a light adjustment member 30A extends up to a position overlapping a part of the first light-emitting portion 11 in plan view.

The light adjustment member 30A overlaps the second light-emitting portion 12 and extends up to a position overlapping about half the first light-emitting portion 11 in plan view. This structure further facilitates wavelength conversion of the second light emitted from the second light-emitting portion 12 by the light adjustment member 30A.

Third Embodiment

Figure 6A:
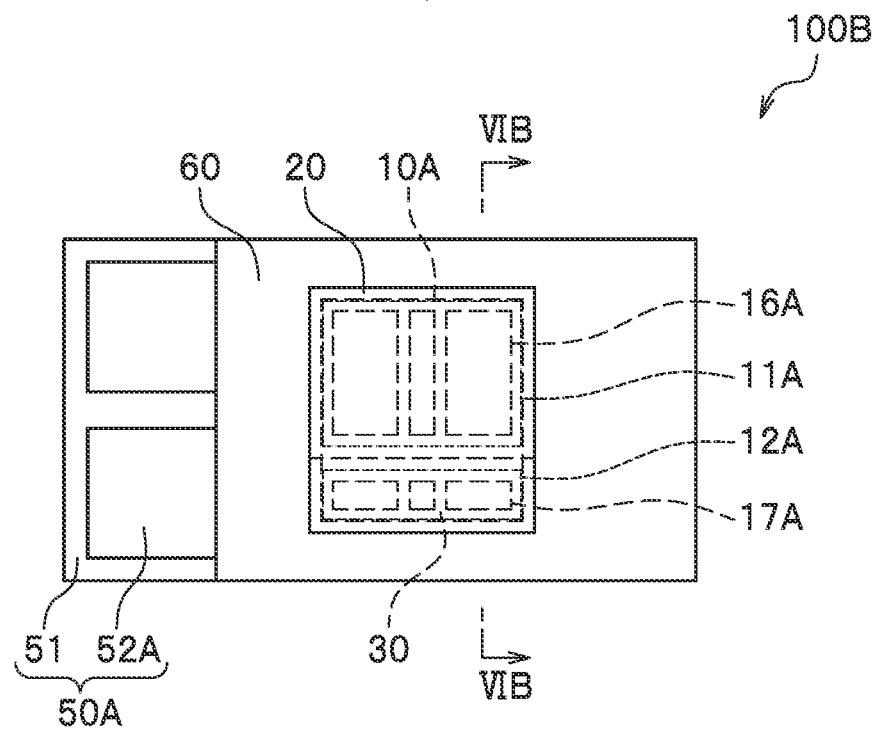
FIG. 6A is a schematic plan view illustrating an example of a light-emitting device according to a third embodiment.
Figure 6B:
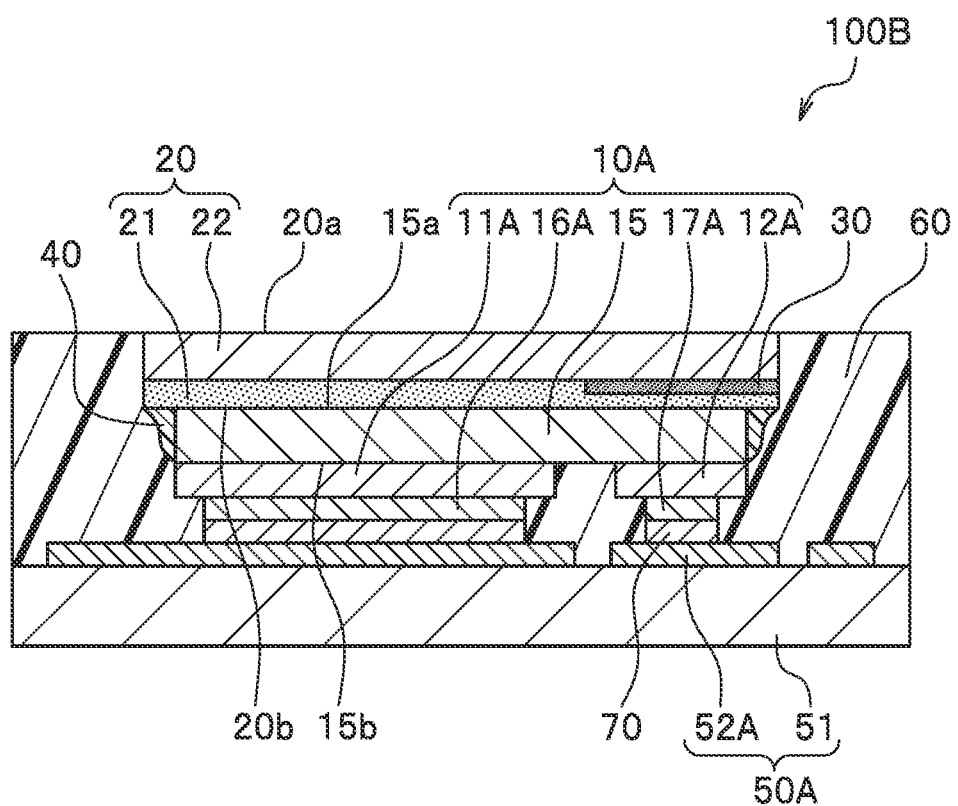
FIG. 6B is a schematic cross-sectional view taken along line VIB-VIB of FIG. 6A.
Figure 6C:
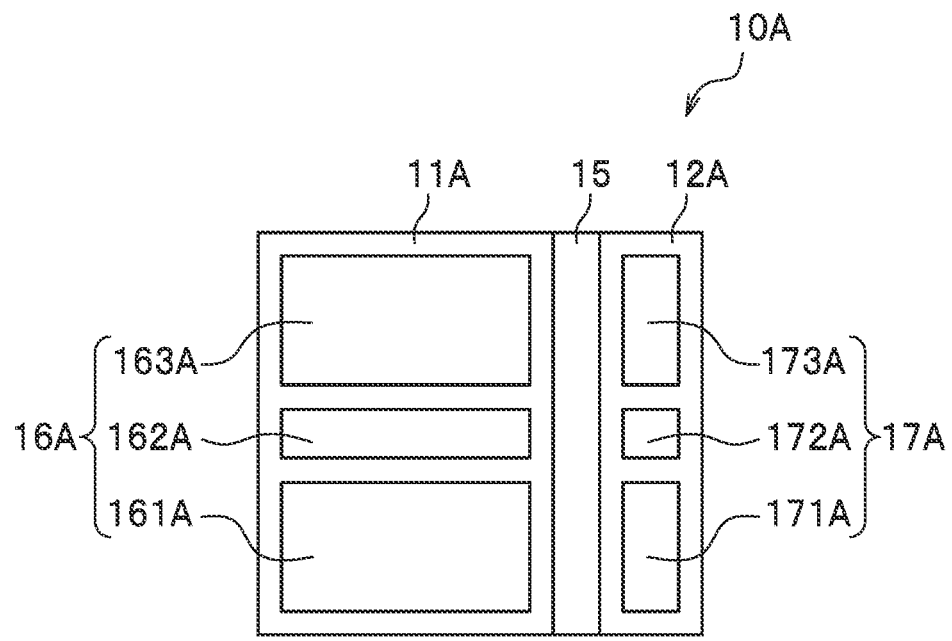
FIG. 6C is a schematic bottom view illustrating an example of a light-emitting element of the light-emitting device according to the third embodiment.
Figure 6D:
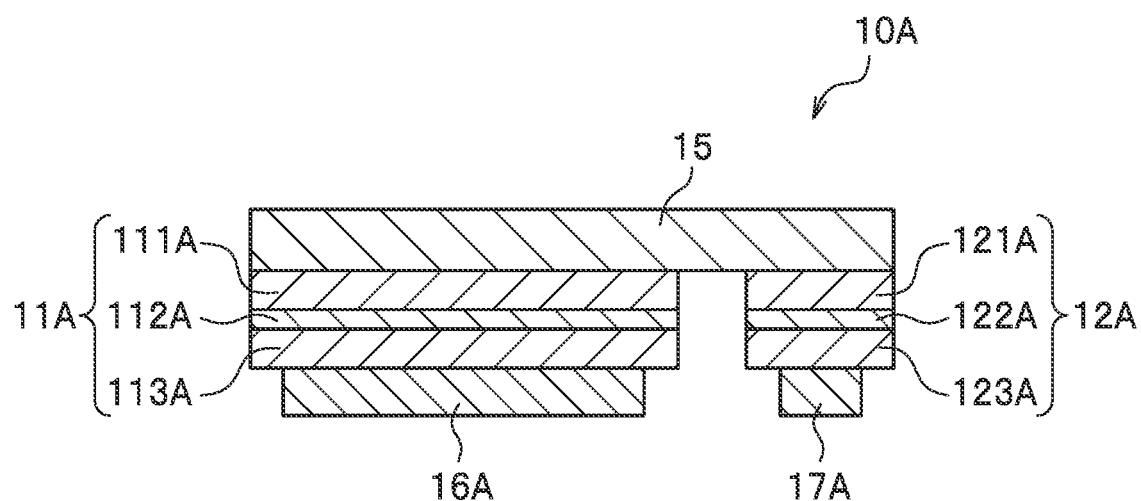
FIG. 6D is a schematic cross-sectional view illustrating an example of the light-emitting element of the light-emitting device according to the third embodiment.
Figure 6E:
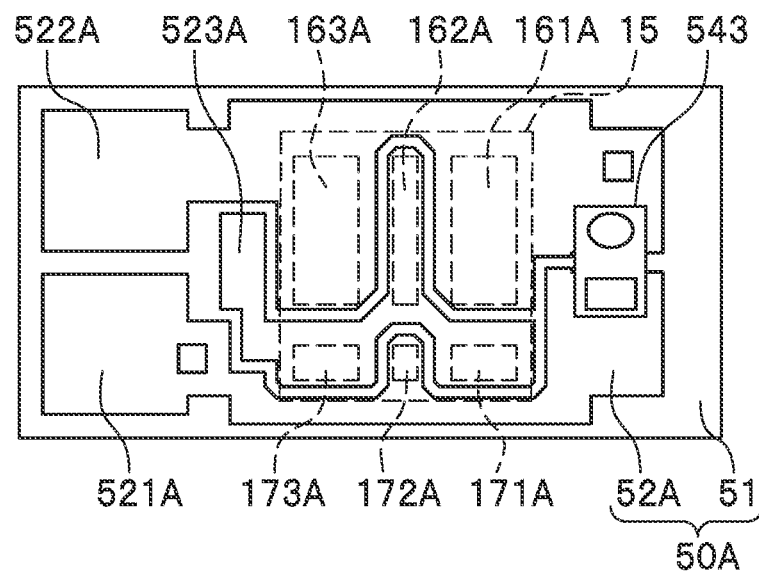
FIG. 6E is a schematic plan view for explaining a wiring substrate of the light-emitting device according to the third embodiment.
Figure 6F:
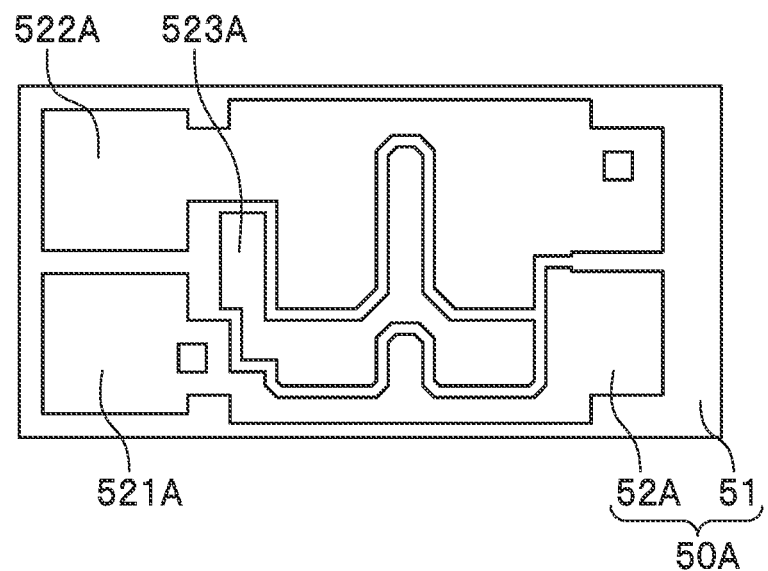
FIG. 6F is a schematic plan view illustrating an example of the wiring substrate of the light-emitting device according to the third embodiment.

FIG. 6A is a schematic plan view illustrating an example of a light-emitting device according to a third embodiment. FIG. 6B is a schematic cross-sectional view taken along line VIB-VIB of FIG. 6A. FIG. 6C is a schematic bottom view illustrating an example of a light-emitting element of the light-emitting device according to the third embodiment. FIG. 6D is a schematic cross-sectional view illustrating an example of the light-emitting element of the light-emitting device according to the third embodiment. FIG. 6E is a schematic plan view for explaining a wiring substrate of the light-emitting device according to the third embodiment. FIG. 6F is a schematic plan view illustrating an example of the wiring substrate of the light-emitting device according to the third embodiment.

A light-emitting device 100B differs from the light-emitting device 100 according to the first embodiment in that a first light-emitting portion 11A and a second light-emitting portion 12A of a light-emitting element 10A have different areas in plan view. Specifically, a light-emitting surface of the first light-emitting portion 11A is larger than a light-emitting surface of the second light-emitting portion 12A in plan view. With this structure, even when a wiring substrate 50A includes a wiring 52A serially connecting the first light-emitting portion 11A and the second light-emitting portion 12A, the first light-emitting portion 11A and the second light-emitting portion 12A can have different current densities during light emission. Accordingly, a region having a higher luminance than that on the first light-emitting portion 11A side during light emission of the light-emitting device 100B can be disposed on the side of the second light-emitting portion 12A having a smaller light-emitting area.

A semiconductor layered body of the first light-emitting portion 11A includes a first semiconductor layer 111A, a light-emitting layer 112A, and a second semiconductor layer 113A from the support substrate 15 side. A semiconductor layered body of the second light-emitting portion 12A includes a first semiconductor layer 121A, a light-emitting layer 122A, and a second semiconductor layer 123A from the support substrate 15 side. The first light-emitting portion 11A and the second light-emitting portion 12A are disposed adjacent to each other with a gap therebetween on the second surface 15b of the support substrate 15. The first light-emitting portion 11A is provided with three electrodes of an N-side electrode 161A, a P-side electrode 162A, and an N-side electrode 163A, as a first element electrode 16A. Similarly, the second light-emitting portion 12A is provided with three electrodes of an N-side electrode 171A, a P-side electrode 172A, and an N-side electrode 173A, as a second element electrode 17A. The first element electrode 16A and the second element electrode 17A are sized according to the difference in area between the first light-emitting portion 11A and the second light-emitting portion 12A.

The wiring substrate 50A includes the wiring 52A serially connecting the first light-emitting portion 11A and the second light-emitting portion 12A.

The wiring 52A includes, for example, a first wiring 521A, a second wiring 522A, and a third wiring 523A. The first wiring 521A is provided with the P-side electrode 172A, the second wiring 522A is provided with the N-side electrode 161A and the N-side electrode 163A, and the third wiring 523A is provided with the P-side electrode 162A, the N-side electrode 171A, and the N-side electrode 173A. In addition, the first wiring 521A and the second wiring 522A are provided with an electronic component 543. With the wiring 52A, the wiring substrate 50A allows the first light-emitting portion 11A and the second light-emitting portion 12A to have different current densities during light emission.

Fourth Embodiment

Figure 7A:
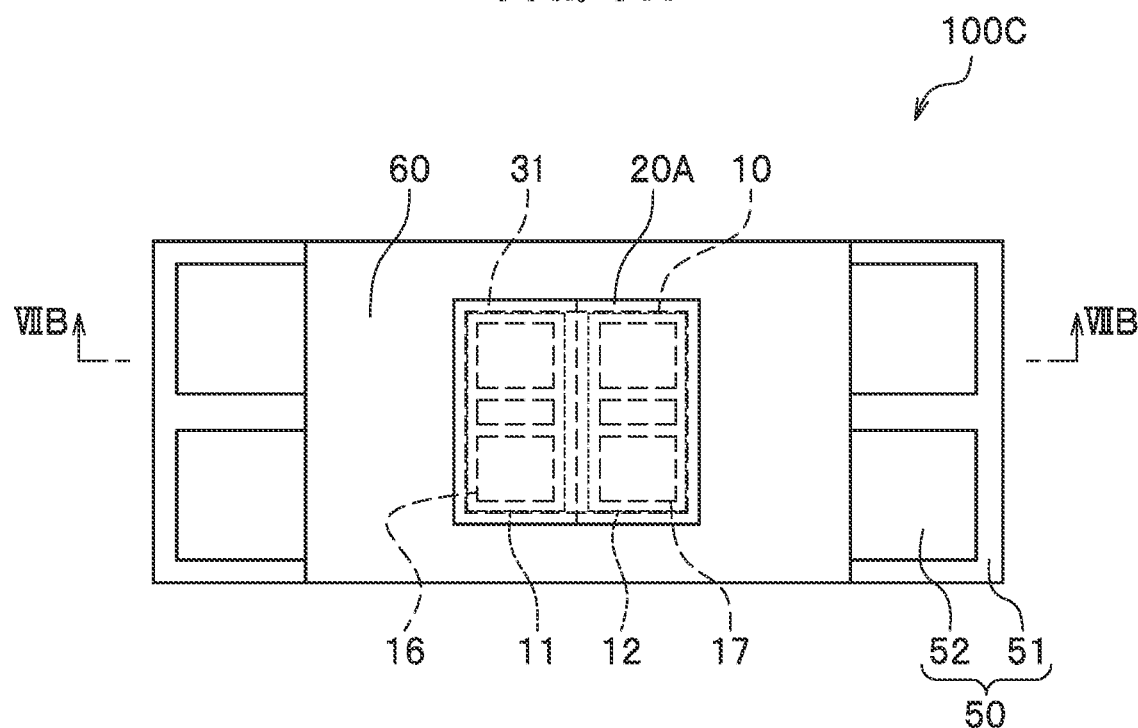
FIG. 7A is a schematic plan view illustrating an example of a light-emitting device according to a fourth embodiment.
Figure 7B:
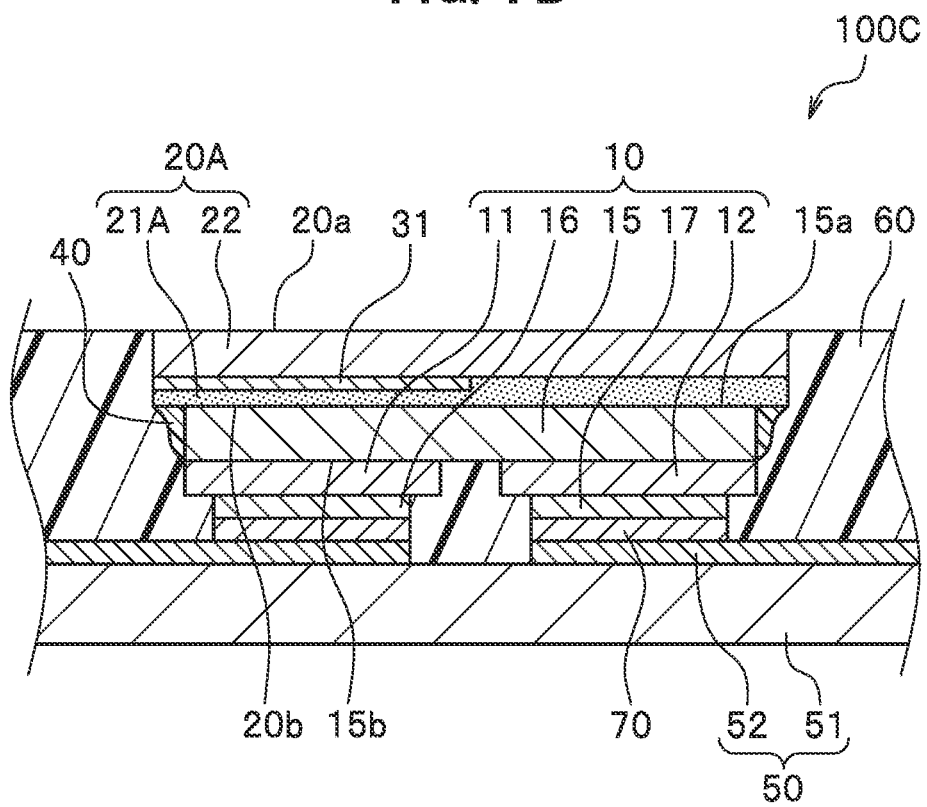
FIG. 7B is a schematic cross-sectional view taken along line VIIB-VIIB of FIG. 7A.

FIG. 7A is a schematic plan view illustrating an example of a light-emitting device according to a fourth embodiment. FIG. 7B is a schematic cross-sectional view taken along line VIIB-VIIB of FIG. 7A.

A light-emitting device 100C differs from the light-emitting device 100 according to the first embodiment in that the phosphor concentration of a wavelength conversion layer 21A in a wavelength conversion member 20A is high. In addition, a light adjustment member 31 does not contain a phosphor and is disposed overlapping the first light-emitting portion 11 in plan view. The light adjustment member 31 is, for example, a light-transmissive layer that transmits the first light and the third light, and a material similar to the materials for the binder of the wavelength conversion layer 21 that are described as examples can be used. For this arrangement, the wavelength conversion member 20A is disposed such that the light adjustment member 31 overlaps the first light-emitting portion 11 in plan view in the step S13 of disposing the wavelength conversion member. The light adjustment member 31 may include a light diffusion member, as necessary. As the light diffusion member, titanium oxide, barium titanate, aluminum oxide, or silicon oxide, for example, can be used.

The phosphor concentration of the wavelength conversion layer 21A is preferably set in accordance with the second light having a high emission intensity that is emitted from the second light-emitting portion 12. Specifically, it is preferably set in accordance with the peak wavelength during light emission of the second light-emitting portion 12. For example, the phosphor concentration of the wavelength conversion layer 21A is preferably in a range from 60 mass % to 70 mass %.

In the light-emitting device 100C in which the phosphor concentration of the wavelength conversion layer 21A is set in accordance with the second light having a high emission intensity, when the wavelength conversion layer 21 having a uniform thickness is disposed on the first light-emitting portion 11 and the second light-emitting portion 12, the phosphor concentration is set high for the first light having a low emission intensity, causing more first light to be subjected to wavelength conversion. In other words, the proportion of the first light in light emitted from the first light-emitting portion 11 side is lower than the proportion of the second light in light emitted from the second light-emitting portion 12 side, in the light-emitting device 100C. Therefore, the light adjustment member 31 is disposed overlapping the first light-emitting portion 11 that emits the first light in plan view, whereby it is possible to reduce the amount of the phosphor at the position overlapping the first light-emitting portion 11 in plan view. This reduces the amount of the third light obtained by wavelength conversion of the first light and improves uneven chromaticity.

Fifth Embodiment

Figure 8A:
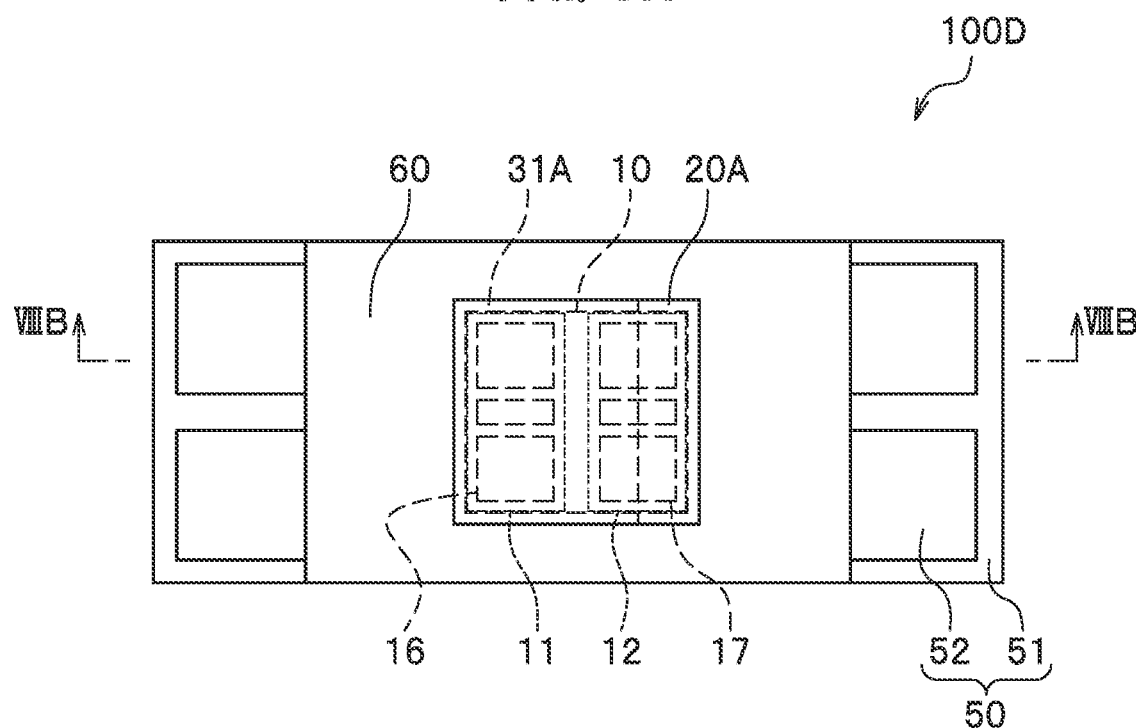
FIG. 8A is a schematic plan view illustrating an example of a light-emitting device according to a fifth embodiment.
Figure 8B:
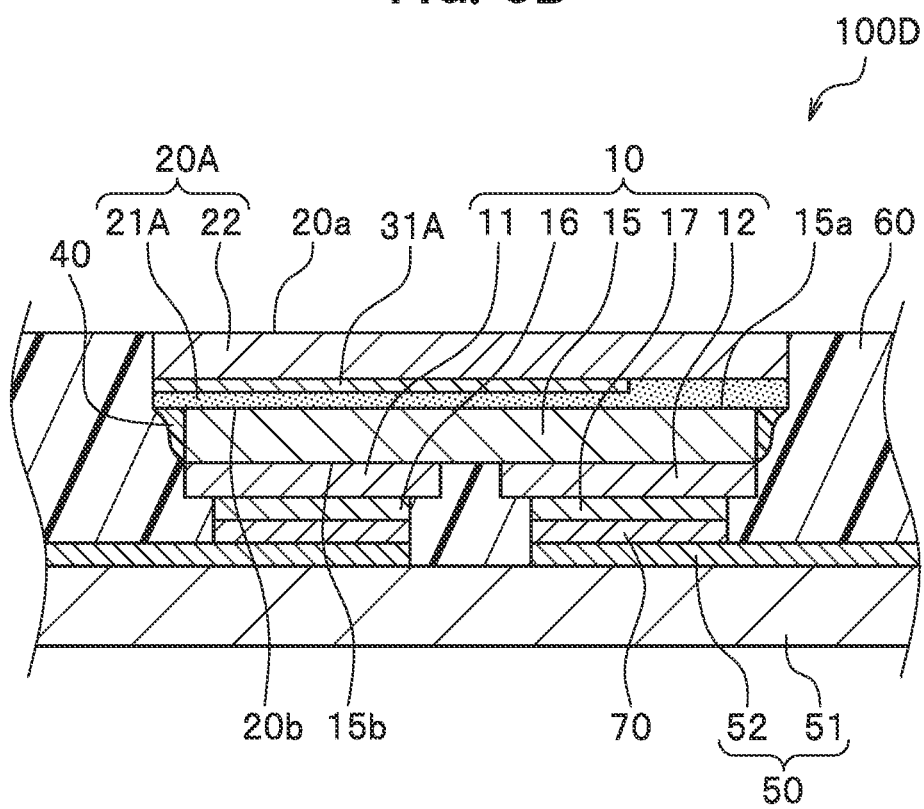
FIG. 8B is a schematic cross-sectional view taken along line VIIIB-VIIIB of FIG. 8A.

FIG. 8A is a schematic plan view illustrating an example of a light-emitting device according to a fifth embodiment. FIG. 8B is a schematic cross-sectional view taken along line VIIIB-VIIIB of FIG. 8A.

A light-emitting device 100D differs from the light-emitting device 100C according to the fourth embodiment in that a light adjustment member 31A extends up to a position overlapping a part of the second light-emitting portion 12 in plan view.

The light adjustment member 31A overlaps the first light-emitting portion 11 and extends up to a position overlapping about half the second light-emitting portion 12 in plan view. With such a structure, it is possible to further reduce the amount of the third light obtained by wavelength conversion of the first light and improve uneven chromaticity.

Sixth Embodiment

Figure 9A:
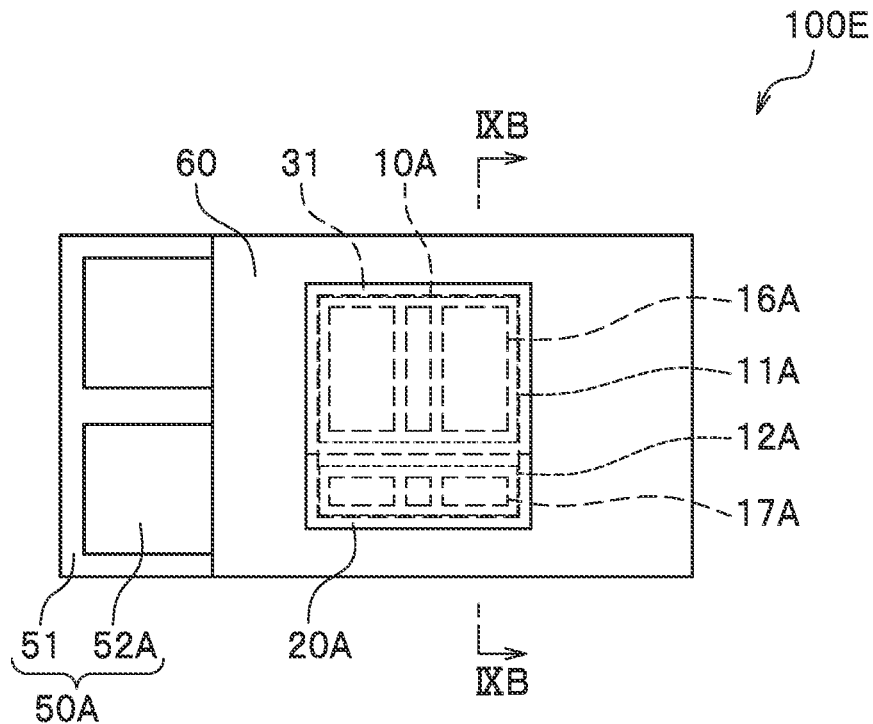
FIG. 9A is a schematic plan view illustrating an example of a light-emitting device according to a sixth embodiment.
Figure 9B:
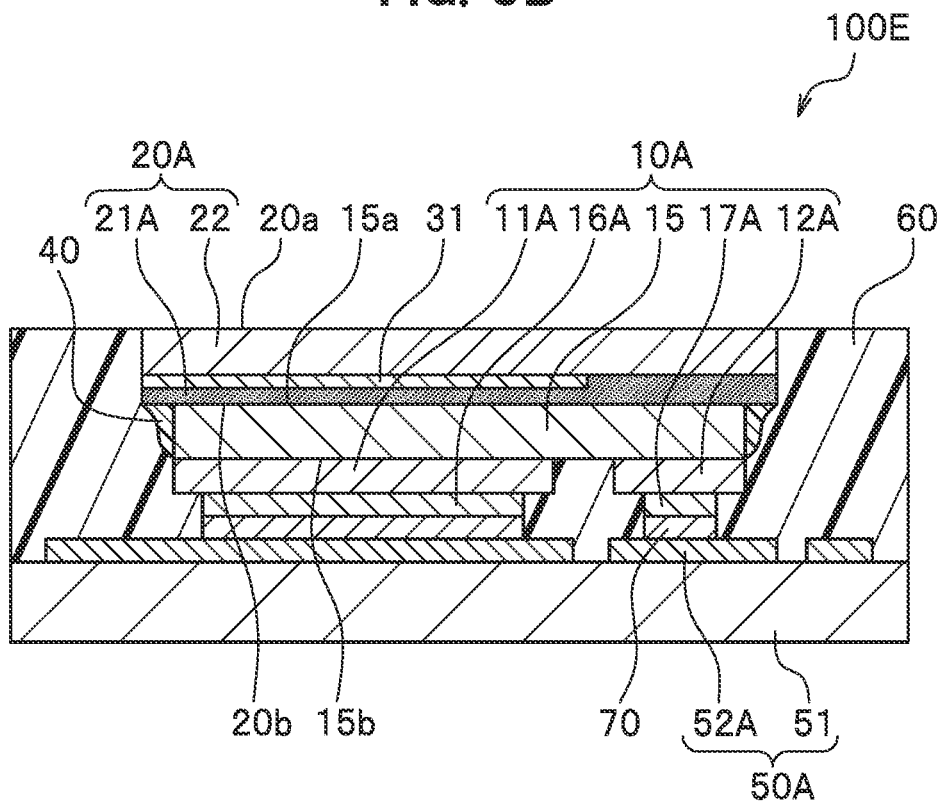
FIG. 9B is a schematic cross-sectional view taken along line IXB-IXB of FIG. 9A.

FIG. 9A is a schematic plan view illustrating an example of a light-emitting device according to a sixth embodiment. FIG. 9B is a schematic cross-sectional view taken along line IXB-IXB of FIG. 9A.

A light-emitting device 100E differs from the light-emitting device 100C according to the fourth embodiment in that a light-emitting surface of the first light-emitting portion 11A is larger than a light-emitting surface of the second light-emitting portion 12A in plan view. In addition, the wiring substrate 50A includes the wiring 52A serially connecting the first light-emitting portion 11A and the second light-emitting portion 12A. The wiring 52A can be sized according to a difference in area between the first light-emitting portion 11A and the second light-emitting portion 12A. With this structure, even when the wiring substrate 50A includes the wiring 52A serially connecting the first light-emitting portion 11A and the second light-emitting portion 12A, the first light-emitting portion 11A and the second light-emitting portion 12A can have different current densities during light emission.

Seventh Embodiment

Figure 10A:
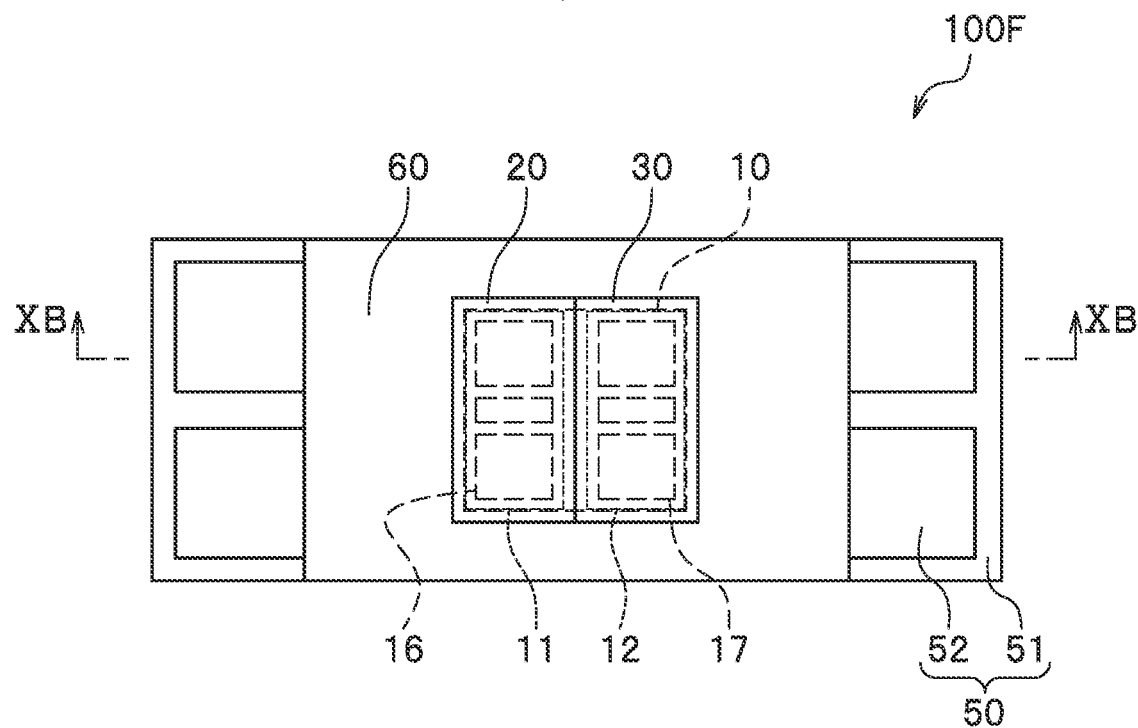
FIG. 10A is a schematic plan view illustrating an example of a light-emitting device according to a seventh embodiment.
Figure 10B:
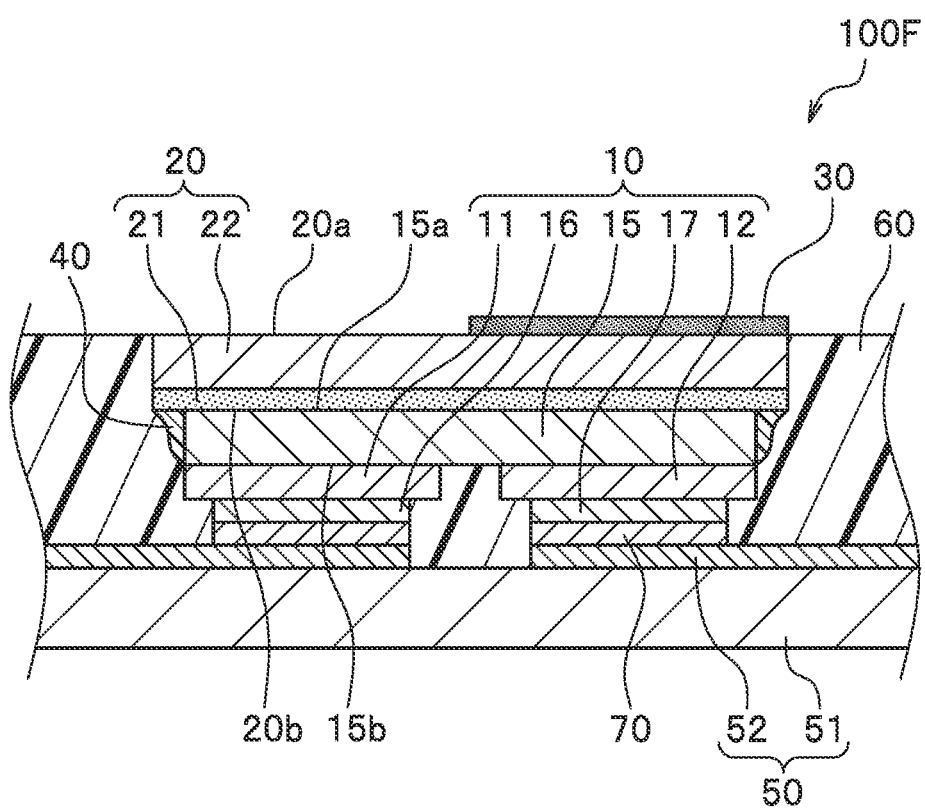
FIG. 10B is a schematic cross-sectional view taken along line XB-XB of FIG. 10A.

FIG. 10A is a schematic plan view illustrating an example of a light-emitting device according to a seventh embodiment. FIG. 10B is a schematic cross-sectional view taken along line XB-XB in FIG. 10A.

A light-emitting device 100F differs from the light-emitting device 100 according to the first embodiment in that the light adjustment member 30 is disposed on the first surface 20a of the wavelength conversion member 20 and overlaps the second light-emitting portion 12 in plan view. This structure facilitates adjustment of the position at which the light adjustment member 30 is disposed.

To manufacture the light-emitting device 100F, the wavelength conversion member 20 provided with the light adjustment member 30 on the surface of the light-transmissive member 22 opposite to the surface on the wavelength conversion layer 21 side is prepared in the step S12 of preparing the wavelength conversion member, and the wavelength conversion member 20 is disposed such that the surface on the wavelength conversion layer 21 side is located on the first surface 15a side of the support substrate 15 in the step S13 of disposing the wavelength conversion member.

Eighth Embodiment

Figure 11:
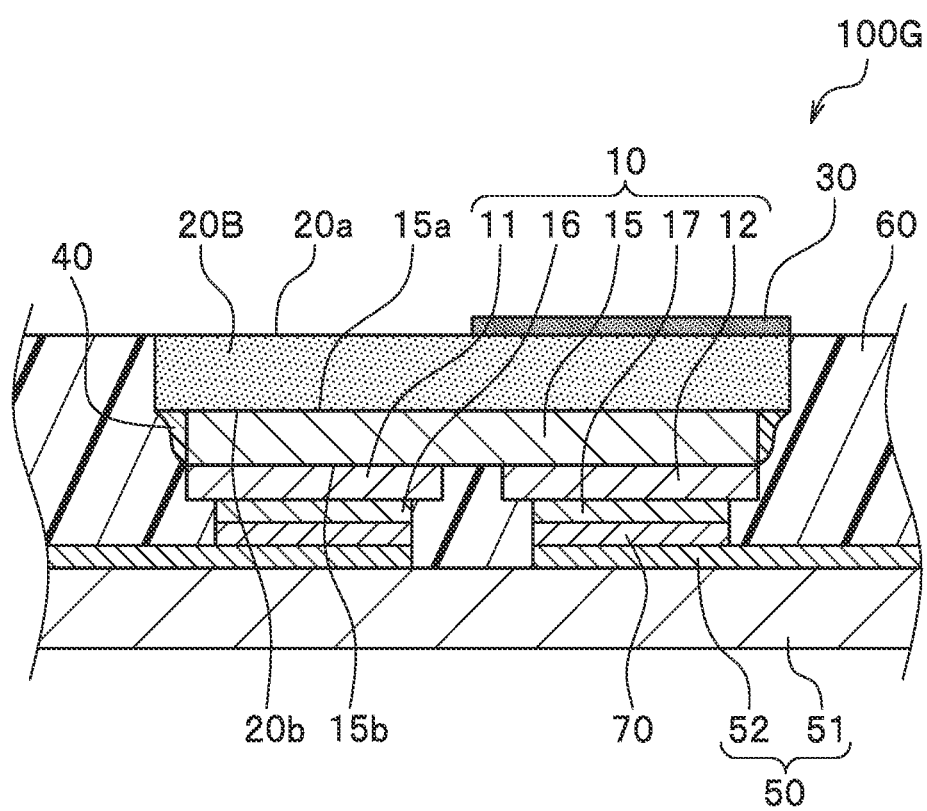
FIG. 11 is a schematic cross-sectional view illustrating an example of a light-emitting device according to an eighth embodiment.

FIG. 11 is a schematic cross-sectional view illustrating an example of a light-emitting device according to an eighth embodiment.

A light-emitting device 100G differs from the light-emitting device 100F according to the seventh embodiment in that a wavelength conversion member 20B is composed of a single layer. The wavelength conversion member 20B may be composed of, for example, only a single layer of the wavelength conversion layer 21 described for the light-emitting device 100 or made of a sintered body of a phosphor. The phosphor concentration of the wavelength conversion member 20B is, for example, in a range from 80 mass % to 90 mass %. The phosphor concentration refers to the proportion of the phosphor in the total amount of the wavelength conversion member 20B containing the phosphor. In addition, the wavelength conversion member 20B may include a light diffusion member, as necessary.

Ninth Embodiment

Figure 12:
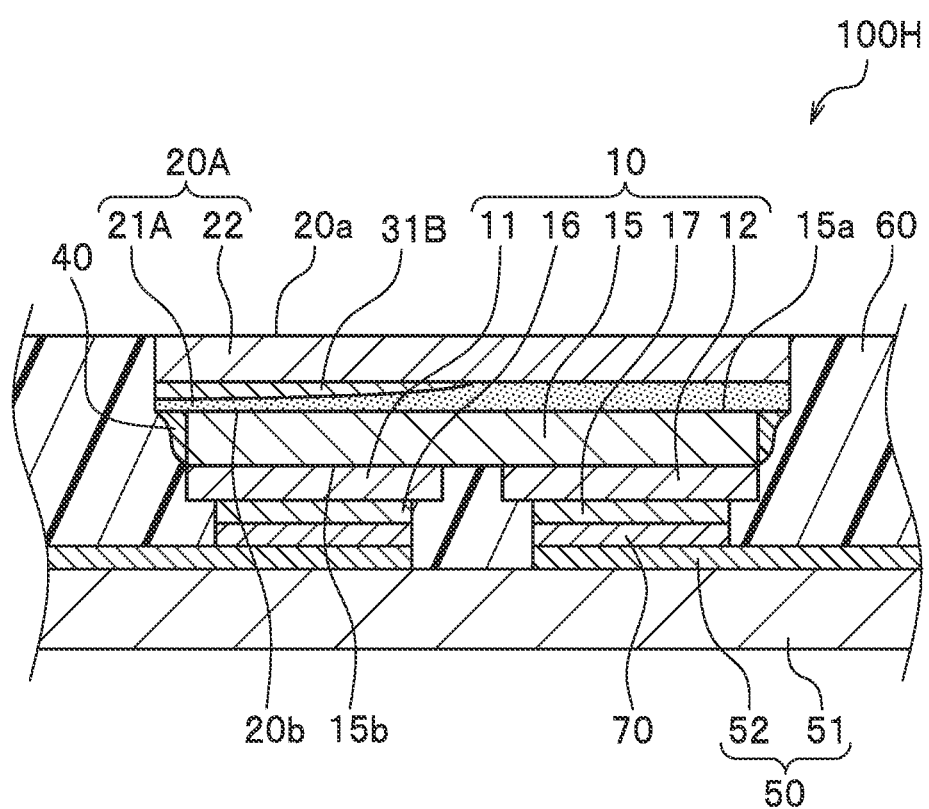
FIG. 12 is a schematic cross-sectional view illustrating an example of a light-emitting device according to a ninth embodiment.

FIG. 12 is a schematic cross-sectional view illustrating an example of a light-emitting device according to a ninth embodiment.

A light-emitting device 100H differs from the light-emitting device 100C according to the fourth embodiment in that the thickness of a light adjustment member 31B is not uniform. The light adjustment member 31B is a light-transmissive layer that transmits the first light and the third light. In the present embodiment, the light adjustment member 31B preferably includes a light diffusion member. The light adjustment member 31B has a lower surface inclined with respect to the first surface 15a of the support substrate 15 such that its thickness gradually decreases from the outer edge on the first light-emitting portion 11 side of the wavelength conversion member 20A to the second light-emitting portion 12 side. Here, the lower surface of the light adjustment member 31B has a gently curved shape in a cross-sectional view. The lower surface of the light adjustment member 31B may have a linear shape, or a linear shape and a curved shape, in a cross-sectional view. In addition, the light adjustment member 31B may have a thickness that is gradually decreased or may have a portion with a uniform thickness. For example, the light adjustment member 31B may have a uniform thickness from the outer edge on the first light-emitting portion 11 side of the wavelength conversion member 20A, toward the second light-emitting portion 12 side, up to about one third of the first light-emitting portion 11 from the outer edge side, and then the thickness may gradually decrease from the uniform thickness.

In the light-emitting device 100H, the light adjustment member 31B containing the light diffusion member has the inclined lower surface, whereby the boundary between the first light-emitting portion 11 side and the second light-emitting portion 12 side in light emitted from the light-emitting device 100H can be less visibly recognized. For example, when a value of relative luminance on the light-emitting surface of the light-emitting device 100H is measured, an intermediate luminance region having a luminance between a low luminance (that is, the luminance on the first light-emitting portion 11 side) region and a high luminance (that is, the luminance on the second light-emitting portion 12 side) region, between the low luminance region and the high luminance region. Therefore, in using the light-emitting device 100H as, for example, a light source for an automobile headlight, the luminance can be easily adjusted according to the irradiation area of the headlight, in an optical system.

The light-emitting device according to the present embodiment and the method for manufacturing the light-emitting device have been specifically described above by means of the embodiments for carrying out the invention, but the spirit of the present invention is not limited to these descriptions and should be interpreted broadly based on the appended claims. Various modifications, variations, and the like based on these descriptions are also included within the spirit of the present invention. Further, the aforementioned embodiments may be implemented in combination with each other.

For example, the light adjustment member 31 described above does not contain a phosphor, but the light adjustment member 31 may contain a phosphor that performs wavelength conversion of the first light at a concentration lower than the phosphor concentration of the wavelength conversion layer 21A. The light adjustment member 31 may contain a phosphor having a lower wavelength conversion efficiency than the phosphor of the wavelength conversion layer 21A or a phosphor that does not perform wavelength conversion. In that case, the phosphor concentration of the light adjustment member 31 may be higher than or equal to the phosphor concentration of the wavelength conversion layer 21A.

The light adjustment member 31 containing the phosphor may be disposed on the surface of the light-transmissive member 22 on the side opposite to the surface on the wavelength conversion layer 21A side, or may be disposed on the surface of the wavelength conversion member 20A on the support substrate 15 side.

The light-emitting device may include, for example, three or more light-emitting portions. In addition, the number of element electrodes disposed on one light-emitting portion may be two, or four or more. The light guide member and the covering member need not be provided. The wavelength conversion member includes three or more layers. In that case, the phosphor concentration is the ratio of the phosphor to the total amount of the phosphor-containing layer in the wavelength conversion member. When the first light-emitting portion and the second light-emitting portion have the same area in plan view, a wiring substrate provided with a wiring that serially connects the first light-emitting portion and the second light-emitting portion may be provided with a constant-current diode to make the first light-emitting portion and the second light-emitting portion have different current densities during light emission. Even when the first light-emitting portion and the second light-emitting portion have different areas in plan view, the first light-emitting portion and the second light-emitting portion may be individually driven to have different current densities during light emission.

Furthermore, in the method for manufacturing the light-emitting device, the order of some steps is not limited, and the order can be reversed. For example, the light adjustment member may be disposed on the wavelength conversion member after the wavelength conversion member is disposed on the light-emitting element. The light adjustment member may be disposed on the wavelength conversion member after the covering member is disposed on the wiring substrate. The wavelength conversion member may be disposed on the light-emitting element after the light-emitting element is disposed on the wiring substrate.

Some aspects of light-emitting devices and methods for manufacturing the light-emitting devices according to the embodiments of the present disclosure are as follows.

Aspect 1

A light-emitting device including a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order; a wavelength conversion member disposed on the first surface of the support substrate and containing a phosphor that performs wavelength conversion of first light emitted from the first light-emitting portion and second light emitted from the second light-emitting portion into third light; and a light adjustment member disposed on a surface of the wavelength conversion member opposite to a surface on the support substrate side or disposed inside the wavelength conversion member and overlapping one of the first light-emitting portion and the second light-emitting portion in plan view, in which in the light-emitting element, an emission intensity of the first light at a light emission peak wavelength of the second light is lower than an emission intensity of the second light at the light emission peak wavelength of the second light, during light emission of the light-emitting device.

Aspect 2

The light-emitting device according to the aspect 1, in which the wavelength conversion member includes a wavelength conversion layer containing the phosphor, and a light-transmissive member supporting the wavelength conversion layer.

Aspect 3

The light-emitting device according to the aspect 2, in which the light adjustment member is disposed on a surface of the light-transmissive member on the wavelength conversion layer side.

Aspect 4

The light-emitting device according to any one of the aspects 1 to 3, in which a light emission peak wavelength of the first light is longer than the light emission peak wavelength of the second light, the light adjustment member contains a phosphor that performs wavelength conversion of the second light, and the light adjustment member is disposed overlapping the second light-emitting portion in plan view.

Aspect 5

The light-emitting device according to the aspect 4, in which the phosphor contained in the wavelength conversion member and the phosphor contained in the light adjustment member are the same kind of phosphor.

Aspect 6

The light-emitting device according to any one of the aspects 1 to 3, in which a light emission peak wavelength of the first light is longer than the light emission peak wavelength of the second light, the light adjustment member contains no phosphor or contains a phosphor that performs wavelength conversion of the first light at a concentration lower than a phosphor concentration of the layer containing the phosphor of the wavelength conversion member, and the light adjustment member is disposed overlapping the first light-emitting portion in plan view.

Aspect 7

The light-emitting device according to any one of the aspects 1 to 6, in which the first light-emitting portion and the second light-emitting portion have different current densities during light emission.

Aspect 8

The light-emitting device according to the aspect 7, in which the first light-emitting portion and the second light-emitting portion have the same area in plan view.

Aspect 9

The light-emitting device according to the aspect 7, in which the first light-emitting portion and the second light-emitting portion have different areas in plan view.

Aspect 10

The light-emitting device according to the aspect 8 or 9, further including a wiring substrate on which the light-emitting element is disposed, in which the wiring substrate includes a wiring that can individually drive the first light-emitting portion and the second light-emitting portion.

Aspect 11

The light-emitting device according to the aspect 9, further including a wiring substrate on which the light-emitting element is disposed, in which the wiring substrate includes a wiring serially connecting the first light-emitting portion and the second light-emitting portion.

Aspect 12

The light-emitting device according to any one of the aspects 1 to 11, in which the light adjustment member is disposed overlapping one of the first light-emitting portion and the second light-emitting portion in plan view and extends to a position overlapping a part of the other of the first light-emitting portion and the second light-emitting portion.

Aspect 13

The light-emitting device according to any one of the aspects 1 to 12, in which the emission intensity of the first light is in a range from 10 to 70 when the emission intensity of the second light is 100 during light emission.

Aspect 14

The light-emitting device according to any one of the aspects 1 to 13, in which the light emission peak wavelengths of the first light and the second light during light emission are in a range from 420 nm to 460 nm, and a light emission peak wavelength of the third light is in a range from 500 nm to 600 nm.

Aspect 15

The light-emitting device according to any one of the aspects 1 to 14, in which a difference between the light emission peak wavelengths of the first light and the second light during light emission is in a range from 0.1 nm to 15 nm.

Aspect 16

A method for manufacturing a light-emitting device, including preparing a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order; preparing a wavelength conversion member having a first surface and a second surface opposite to the first surface and containing a phosphor that performs wavelength conversion of first light emitted from the first light-emitting portion and second light emitted from the second light-emitting portion into third light, with a light adjustment member disposed on the first surface of the wavelength conversion member or inside the wavelength conversion member; and disposing the wavelength conversion member provided with the light adjustment member such that the second surface of the wavelength conversion member faces the first surface of the support substrate, in which in the disposing the wavelength conversion member, the light adjustment member is disposed overlapping one of the first light-emitting portion and the second light-emitting portion in plan view.

Aspect 17

The method for manufacturing a light-emitting device, according to the aspect 16, in which the wavelength conversion member includes a wavelength conversion layer containing the phosphor and a light-transmissive member supporting the wavelength conversion layer, the preparing the wavelength conversion member includes preparing the wavelength conversion member provided with the light adjustment member on a surface of the light-transmissive member on the wavelength conversion layer side, and in the disposing the wavelength conversion member, the wavelength conversion member is disposed such that the surface on the wavelength conversion layer side is located on the first surface side of the support substrate.

Aspect 18

The method for manufacturing a light-emitting device, according to the aspect 16, in which the wavelength conversion member includes a wavelength conversion layer containing the phosphor and a light-transmissive member supporting the wavelength conversion layer, the preparing the wavelength conversion member includes preparing the wavelength conversion member provided with the light adjustment member on a surface of the light-transmissive member opposite to a surface on the wavelength conversion layer side, and in the disposing the wavelength conversion member, the wavelength conversion member is disposed such that the surface on the wavelength conversion layer side is located on the first surface side of the support substrate.

Aspect 19

The method for manufacturing a light-emitting device, according to the aspect 17, in which the preparing the wavelength conversion member includes disposing the light adjustment member on the light-transmissive member such that the light adjustment member covers a part of the light-transmissive member, and disposing the wavelength conversion layer such that the wavelength conversion layer covers the light adjustment member and the light-transmissive member exposed from the light adjustment member.

Aspect 20

The method for manufacturing a light-emitting device, according to any one of the aspects 16 to 19, in which the light adjustment member contains a phosphor that performs wavelength conversion of the second light, and in the disposing the wavelength conversion member, the light adjustment member is disposed overlapping the second light-emitting portion in plan view.

Aspect 21

The method for manufacturing a light-emitting device, according to any one of the aspects 16 to 19, in which the light adjustment member contains no phosphor or contains a phosphor that performs wavelength conversion of the first light at a concentration lower than a phosphor concentration of the layer containing the phosphor of the wavelength conversion member, and in the disposing the wavelength conversion member, the light adjustment member is disposed overlapping the first light-emitting portion in plan view.

The light-emitting devices according to the embodiments of the present disclosure can be preferably utilized for vehicle lighting such as headlights. In addition, the light-emitting devices according to the embodiments of the present disclosure can be utilized for the light source for a backlight of a liquid crystal display, various types of lighting fixtures, a large display, various types of display devices for advertisements, destination information, and the like, and further, a digital video camera, image reading devices in a facsimile, a copy machine, a scanner, and the like, and a projector device, for example.

What is claimed is:

1. A light-emitting device comprising:
   a light-emitting element including
      a support substrate having a first surface and a second surface opposite to the first surface, and
      a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order;
   a wavelength conversion member disposed on the first surface of the support substrate and containing a phosphor configured to perform wavelength conversion of first light emitted from the first light-emitting portion and second light emitted from the second light-emitting portion into third light; and
   a light adjustment member disposed on a surface of the wavelength conversion member opposite to a surface on a support substrate side or disposed inside the wavelength conversion member, the light adjustment member overlapping one of the first light-emitting portion and the second light-emitting portion in a plan view, wherein
   in the light-emitting element, an emission intensity of the first light at a light emission peak wavelength of the second light is lower than an emission intensity of the second light at the light emission peak wavelength of the second light, during light emission of the light-emitting device.

2. The light-emitting device according to claim 1, wherein the wavelength conversion member includes a wavelength conversion layer containing the phosphor, and a light-transmissive member supporting the wavelength conversion layer.

3. The light-emitting device according to claim 2, wherein the light adjustment member is disposed on a surface of the light-transmissive member on a wavelength conversion layer side.

4. The light-emitting device according to claim 1, wherein
   a light emission peak wavelength of the first light is longer than the light emission peak wavelength of the second light,
   the light adjustment member contains a phosphor configured to perform wavelength conversion of the second light, and
   the light adjustment member overlaps the second light-emitting portion in the plan view.

5. The light-emitting device according to claim 4, wherein the phosphor contained in the wavelength conversion member and the phosphor contained in the light adjustment member are the same kind of phosphor.

6. The light-emitting device according to claim 1, wherein
a light emission peak wavelength of the first light is longer than the light emission peak wavelength of the second light,
the light adjustment member contains no phosphor or contains a phosphor at a concentration lower than a phosphor concentration of a layer containing the phosphor in the wavelength conversion member, the phosphor being configured to perform wavelength conversion of the first light, and
the light adjustment member overlaps the first light-emitting portion in the plan view.

7. The light-emitting device according to claim 1, wherein the first light-emitting portion and the second light-emitting portion have different current densities during light emission.

8. The light-emitting device according to claim 7, wherein an area of the first light-emitting portion is equal to an area of the second light-emitting portion in the plan view.

9. The light-emitting device according to claim 8, further comprising
a wiring substrate on which the light-emitting element is disposed, wherein
the wiring substrate includes a wiring configured to individually drive the first light-emitting portion and the second light-emitting portion.

10. The light-emitting device according to claim 7, wherein
an area of the first light-emitting portion is different from an area of the second light-emitting portion in the plan view.

11. The light-emitting device according to claim 10, further comprising
a wiring substrate on which the light-emitting element is disposed, wherein
the wiring substrate includes a wiring serially connecting the first light-emitting portion and the second light-emitting portion.

12. The light-emitting device according to claim 1, wherein
the light adjustment member overlaps one of the first light-emitting portion and the second light-emitting portion and extends to a position overlapping a part of the other of the first light-emitting portion and the second light-emitting portion in the plan view.

13. The light-emitting device according to claim 1, wherein
when the emission intensity of the second light is 100 during light emission, the emission intensity of the first light is in a range from 10 to 70.

14. The light-emitting device according to claim 1, wherein
the light emission peak wavelengths of the first light and the second light during light emission are in a range from 420 nm to 460 nm, and a light emission peak wavelength of the third light is in a range from 500 nm to 600 nm.

15. The light-emitting device according to claim 1, wherein
a difference between the light emission peak wavelength of the first light and the light emission peak wavelength of the second light during light emission is in a range from 0.1 nm to 15 nm.

16. A method for manufacturing a light-emitting device, comprising:
preparing a light-emitting element including a support substrate having a first surface and a second surface opposite to the first surface, and
a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order;
preparing a wavelength conversion member having a first surface and a second surface opposite to the first surface, and containing a phosphor configured to perform wavelength conversion of first light emitted from the first light-emitting portion and second light emitted from the second light-emitting portion into third light, with a light adjustment member being disposed on the first surface of the wavelength conversion member or inside the wavelength conversion member; and
disposing the wavelength conversion member provided with the light adjustment member such that the second surface of the wavelength conversion member faces the first surface of the support substrate and the light adjustment member overlaps one of the first light-emitting portion and the second light-emitting portion in a plan view.

17. The method for manufacturing a light-emitting device according to claim 16, wherein
the preparing of the wavelength conversion member includes preparing the wavelength conversion member including a wavelength conversion layer containing the phosphor and a light-transmissive member supporting the wavelength conversion layer, with the light adjustment member being disposed on a surface of the light-transmissive member on a wavelength conversion layer side, and
the disposing of the wavelength conversion member includes disposing the wavelength conversion member such that the surface of the light-transmissive member on the wavelength conversion layer side is located on a first surface side of the support substrate.

18. The method for manufacturing a light-emitting device according to claim 17, wherein
the preparing of the wavelength conversion member includes disposing the light adjustment member on the light-transmissive member such that the light adjustment member covers a part of the light-transmissive member, and disposing the wavelength conversion layer such that the wavelength conversion layer covers the light adjustment member and the light-transmissive member exposed from the light adjustment member.

19. The method for manufacturing a light-emitting device according to claim 16, wherein
the preparing of the wavelength conversion member includes preparing the wavelength conversion member including a wavelength conversion layer containing the phosphor and a light-transmissive member supporting the wavelength conversion layer, with the light adjustment member being disposed on a surface of the light-transmissive member opposite to a surface on a wavelength conversion layer side and defining the first surface of the wavelength conversion member, and
the disposing of the wavelength conversion member includes disposing the wavelength conversion member such that the surface on the wavelength conversion layer side is located on a first surface side of the support substrate.

20. The method for manufacturing a light-emitting device according to claim 16, wherein
- the light adjustment member contains a phosphor configured to perform wavelength conversion of the second light, and
- the disposing of the wavelength conversion member includes disposing the wavelength conversion member such that the light adjustment member overlaps the second light-emitting portion in the plan view.

21. The method for manufacturing a light-emitting device according to claim 16, wherein
- the light adjustment member contains no phosphor or contains a phosphor at a concentration lower than a phosphor concentration of a layer containing the phosphor in the wavelength conversion member, the phosphor in the light adjustment member being configured to perform wavelength conversion of the first light, and
- the disposing of the wavelength conversion member includes disposing the wavelength conversion member such that the light adjustment member overlaps the first light-emitting portion in the plan view.

* * * * *